United States Patent
Saha et al.

(10) Patent No.: US 7,221,166 B2
(45) Date of Patent: May 22, 2007

(54) FAULT LOCATION USING MEASUREMENTS FROM TWO ENDS OF A LINE

(75) Inventors: Murari Mohan Saha, Västerås (SE); Eugeniusz Rosolowski, Wroclaw (PL); Jan Izykowski, Wroclaw (PL)

(73) Assignee: ABB AB, Västerås (SE)

( * ) Notice: Subject to any disclaimer, the term of this patent is extended or adjusted under 35 U.S.C. 154(b) by 0 days.

(21) Appl. No.: 10/546,595

(22) PCT Filed: Nov. 22, 2002

(86) PCT No.: PCT/SE02/02144
§ 371 (c)(1),
(2), (4) Date: Oct. 4, 2005

(87) PCT Pub. No.: WO03/044547
PCT Pub. Date: May 30, 2003

(65) Prior Publication Data
US 2006/0142964 A1    Jun. 29, 2006

(30) Foreign Application Priority Data
Nov. 23, 2001    (SE) .................................... 0103916

(51) Int. Cl.
*G01R 31/08*    (2006.01)
(52) U.S. Cl. .................. 324/522; 324/521; 324/512; 324/525; 324/509
(58) Field of Classification Search ................ 324/522, 324/521, 512, 525, 509
See application file for complete search history.

(56) References Cited

U.S. PATENT DOCUMENTS 3,678,377 A * 7/1972 Chiffert ...................... 324/726

(Continued)

FOREIGN PATENT DOCUMENTS

| EP | 0327191 A2 | 8/1989 |
|---|---|---|
| EP | 0819947 A2 | 1/1998 |

OTHER PUBLICATIONS

Novosel et al., "Unsynchronized two-terminal fault location estimation" IEEE Trans. on Power Delivery, V. 11, No. 1, Jan. 1996, p. 130-138.*

Eriksson, et al., "An accurate fault locator with compensation for apparent reactance in the fault resistance resulting from remote-end infeed" IEEE Trans. on Power Apparatus and Systems, V. PAS-104, No. 2, Feb. 1985, pp. 424-436.*

(Continued)

*Primary Examiner*—Andrew Hirshfeld
*Assistant Examiner*—Thomas Valone
(74) *Attorney, Agent, or Firm*—Venable LLP; Eric J. Franklin

(57) ABSTRACT

The present invention relates to a method to locate a fault in a section of a transmission line using measurements of current, voltage and angles between the phases at a first (A) and a second (B) end of said section. The invention is characterised by the steps of, after the occurrence of a fault along the section, calculating a distance ($d_A$, $d_B$) to a fault dependent on a fault current measured at one of said first and second ends and phase voltages measured at both of said first and second ends (A, B), where the distance to fault is calculated from the end (A or B) where the fault current is measured. The invention is particularly suitable when a current transformer at either of the first or second ends (A, B) is saturated. If so, then, a distance (d) to a fault is calculated dependent on a fault current measured at the non-affected end and phase voltages measured at both the affected end and the non-affected end.

9 Claims, 12 Drawing Sheets

U.S. PATENT DOCUMENTS

| | | | |
|---|---|---|---|
| 4,499,417 A | | 2/1985 | Wright et al. |
| 4,559,491 A | * | 12/1985 | Saha .......................... 324/522 |
| 5,446,387 A | * | 8/1995 | Eriksson et al. ............ 324/522 |
| 5,455,776 A | * | 10/1995 | Novosel ...................... 702/59 |
| 5,773,980 A | * | 6/1998 | Yang .......................... 324/525 |
| 6,040,689 A | * | 3/2000 | Gluszek ...................... 324/127 |
| 6,256,592 B1 | | 7/2001 | Roberts et al. |
| 2005/0140352 A1 | * | 6/2005 | Allain et al. ................ 323/357 |

OTHER PUBLICATIONS

Pereira, et al., "Optimization algorithm for fault location in transmission lines considering current transformers saturation" IEEE Trans. on Power Delivery, V. 20, N. 2, Apr. 2005, p. 603-608.*

Saha et al., "A two-end method of fault location immune to saturation of current transformers" Apr. 5-8, 2004, Eighth IEE International Conference on Developments in Power System Protection, vol. 1, p. 172-5.*

L. V. Baginsky et al. "Influence of current-transformer's interaction on transient processes in currents of high-voltage transmission lines' high-speed protection"; Science and Tech, Proceedings of the 4th Korea-Russia Int'l Sympo; Jun. 27-Jul. 1, 2000; pp. 282-288, vol. 2.

A. Gopalakrishnan et al. "Fault location using the distributed parameter transmission line model"; Power Delivery, IEEE Transactions; Oct. 2000; pp. 1169-1174; vol. 15, Issue 4.

* cited by examiner

FAULT LOCATION USING MEASUREMENTS FROM TWO ENDS OF A LINE

CROSS-REFERENCE TO RELATED APPLICATIONS

This application claims priority to Swedish patent application 0103916-3 filed Nov. 23, 2001 and is the national phase under 35 U.S.C. § 371 of PCT/SE02/02144.

TECHNICAL FIELD

The present invention is concerned with a method and device for locating a fault on a section of a power transmission line. The method utilizes measurements of current and voltage made at relays installed at terminals at both ends of the section of the power line.

BACKGROUND ART

Several methods and approaches for fault location in high voltage power systems have been developed and employed. One approach has been to use voltage/current transducers located at terminals, between which the power lines to be monitored run. Inductive current transformers are used to provide a measurement of instantaneous current in a transmission line.

However, inductive current transformers (CTs) may become saturated under transmission line faults with high fault current, which often takes place during faults close to CTs installation point. The saturation is possible especially for faults in which there is a slowly decaying dc component in the fault current.

Saturation of CTs influences operation of protective relays as well as the accuracy of fault location for inspection-repair purposes. Note that accuracy of both one-end and two-end fault locators can be adversely affected by the saturated CTs. U.S. Pat. No. 4,559,491 which is titled Method and device for locating a fault point on a three-phase power transmission line, discloses a method and device wherein a single end fault locator uses measurements of voltages and currents from a particular side [1], and, if at the side where the fault locator is installed the CTs are saturated, the achieved accuracy of fault location could be unsatisfactory.

Better conditions may be obtained for the above single end fault location for the case when the CTs are saturated at the terminal which is opposite to the fault locator installation point. In such cases the input post fault currents of the fault locator are not contaminated due to saturation of CTs. However, greater accuracy of fault location in such cases can be achieved if impedance of a source from the remote side (where CTs are saturated) is known. The remote source impedance cannot be determined with one-end measurements and therefore in some applications the one-end fault locator may be augmented by inputting a value for the remote end impedance. This value may be measured by the other remote device and sent via a communication channel. Note that in this case the measured remote source impedance can differ greatly from the actual value due to saturation of CTs. Using an inaccurately measured source impedance could deteriorate substantially the fault location accuracy.

Similarly, accuracy of fault location with two-end methods, as for example with the representative methods disclosed in U.S. Pat. No. 5,455,776 which is titled Automatic fault location system, and in U.S. Pat. No. 6,256,592B1 [2–3] which is titled Multi-ended fault location system, are also affected by saturation of CTs. The method of U.S. Pat. No. 5,455,776 [2] uses symmetrical components of voltages and currents from both sides of a line. In case of the method disclosed in U.S. Pat. No. 6,256,592B1 [3] the amplitude of the remote current and the amplitude of the remote source impedance, both determined for the negative sequence, are utilized for calculating a distance to fault. The distortion of the currents, resulting from any saturated CTs, affects the accuracy of both the above two-end fault location techniques [2–3]. No countermeasures against the possible effects of saturation are disclosed in the cited methods [2–3].

SUMMARY OF THE INVENTION

The aim of the present invention is to remedy the above mentioned problems.

This is obtained by a method according to claim 1 and a device for carrying out the method according to claim 6. Specific features of the present invention are characterised by the appending claims.

New fault location algorithms have been derived according to an embodiment of the present invention. The algorithm utilizes post fault measurements of voltages from both the line section ends and post fault current from one end only of the line section. The synchronized or unsynchronized measurements can be used. In case of unsynchronized measurements there is a need for synchronizing the measurements in order to provide a common time base for all the measurements. This can be obtained by introducing the term $e^{j\delta}$, where $\delta$ is the synchronization angle, calculated from pre-fault measurements or post-fault measurements from the sound phases.

The present invention presents an entirely different solution to the problem of adverse influence of the saturation of CTs in relation to fault location. The new two-end fault location technique herein described is immune to problems caused by saturation of CTs. To achieve this aim the redundancy of information contained in the voltages and currents, measured at both the terminals of a transmission line, has been explored. It is important that the exploring of the redundancy is done in such a way that the post-fault currents from a saturated CT are completely ignored and thus not used in calculations for determining a distance to fault. Contrary to that, the currents from the opposite side of a line, the non-affected end where CTs do not saturate, are used to calculate a distance to fault. Such an approach is possible under the above-mentioned assumption that CTs may be saturated at one end of a line only. A known means may be used for determining whether a current transformer either a first or and second end (A, B) of the line is saturated, as described in more detail below. In contrast to measurements of current, measurements of voltages acquired post-fault at both the terminals of a transmission line are utilized in the location procedure proposed by the invention.

The main advantage of the fault location algorithm according to the present invention is that adverse influence of CT saturation on fault location accuracy is avoided by using post fault currents from one non-affected end as the input signals, i.e. from the end where the saturation is not detected, while utilizing post fault voltages from line terminals at both ends. Among the other advantages of the invention are that impedances of equivalent systems behind both the line ends are not required to be known; and that the form of the algorithm is compact because a first order formula has been obtained.

The information in the form of a result for the distance to a fault ($d_A$ or $d_{A\text{-}comp}$, $d_B$ or $d_{B\text{-}comp}$ or d) generated by the fault location method, device or system may also be embodied as a data signal for communication via a network. The data signal may also be used to provide a basis for a control action. The distance to a fault may be sent as a signal for a control action such as: automatic notification to operational network centres of fault and it's location or to automatically start calculations to determine journey time to location, which repair crew shall be dispatched to site, possible time taken to execute a repair, calculate which vehicles or crew member may be needed, how many shifts work per crew will be required and the like actions.

In another aspect of the invention a computer program product is provided on a computer readable media which carries out steps of the method of the invention.

In an advantageous embodiment greater accuracy for measurements on long sections or long lines may be achieved by incorporating compensation for shunt capacitances of a line. The distributed long line model is utilized for that purpose.

BRIEF DESCRIPTION OF THE DRAWINGS

A more complete understanding of the method and device of the present invention may be gained by reference to the following detailed description when taken in conjunction with the accompanying drawings wherein:

FIG. 15 show faults from a–g, and FIGS. 16a, 16b faults between phases a–b. FIG. 17 shows an a-b-g fault. FIGS. 18a and 18b show symmetrical faults a-b-c and a-b-c-g respectively.

DESCRIPTION OF THE PREFERRED EMBODIMENTS

Figure 1:
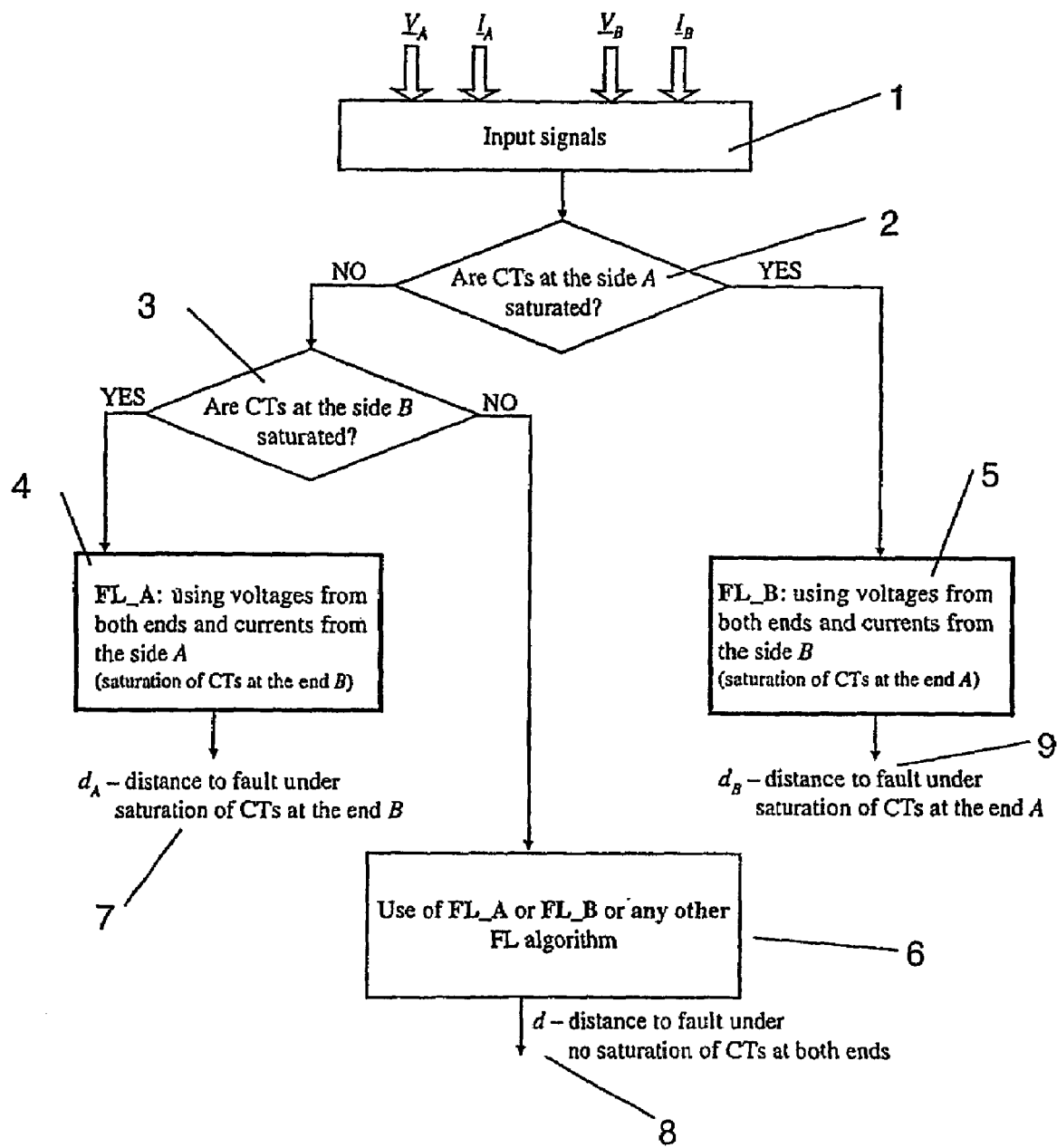
FIG. 1 shows a flowchart for a method for locating a fault according to an embodiment of the invention.

FIG. 1 shows a method in the form of a flow chart according to an embodiment of the invention. The flow chart shows means 1 for receiving input signals, a decision step 2 to determine if a CT is at one end A is saturated, and a second decision step 3 to determine whether a CT at B is or is not saturated (when step 2=Yes). A result stage 4 is shown for when Fault Location FL_A shall be used, result stage 5 when Fault Location FL_B shall be used, and result stage 6 when any Fault location algorithm including FL_A or FL_B may be used.

A determination of whether a CT is saturated or not may be carried out using a method disclosed in EP 506 035 B1 entitled Method and device for detecting saturation in current transformers, or by any other known method. The method disclosed in EP 506 035 B1 is dependent on continuously determining an absolute value of both the current and of a derivative of the current. Three criteria calculated from the measured and derived values are disclosed which, when satisfied simultaneously, determine that a current transformer is saturated.

Figure 2:
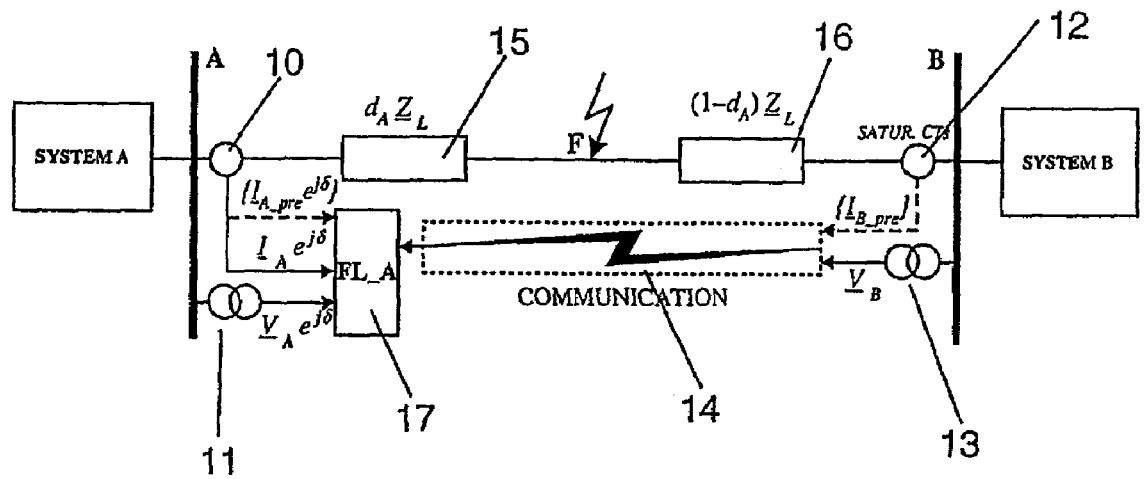
FIG. 2 shows a schematic diagram for a method for locating a fault in a section of transmission line A, B during which fault a current transformer is saturated at B.

FIG. 2 shows a section of a transmission line with points A and B. Included in the figure are a CTs 10, 12 and voltage transformers 11, 13. A means of communication 14 between the two ends A and B is shown. A fault F is shown at a distance $d_A$ from end A. Pre fault currents $\underline{I}_{A\_pre}$ are shown at the A end and the B end $\underline{I}_{B\_pre}$. Post-fault current $\underline{I}_A$ and post-fault voltage $\underline{V}_A$ is shown at the A end, and a post-fault voltage $\underline{V}_B$ only is shown at the B end. The impedance of the section A to B is shown composed in part by impedance 15, equal to $d_A \underline{Z}_L$ for the part from A to the fault F; and by impedance 16, equal to $(1-d_A)\underline{Z}_L$ for the part from end B to fault F. A fault locator procedure 17 is shown.

Figure 3:
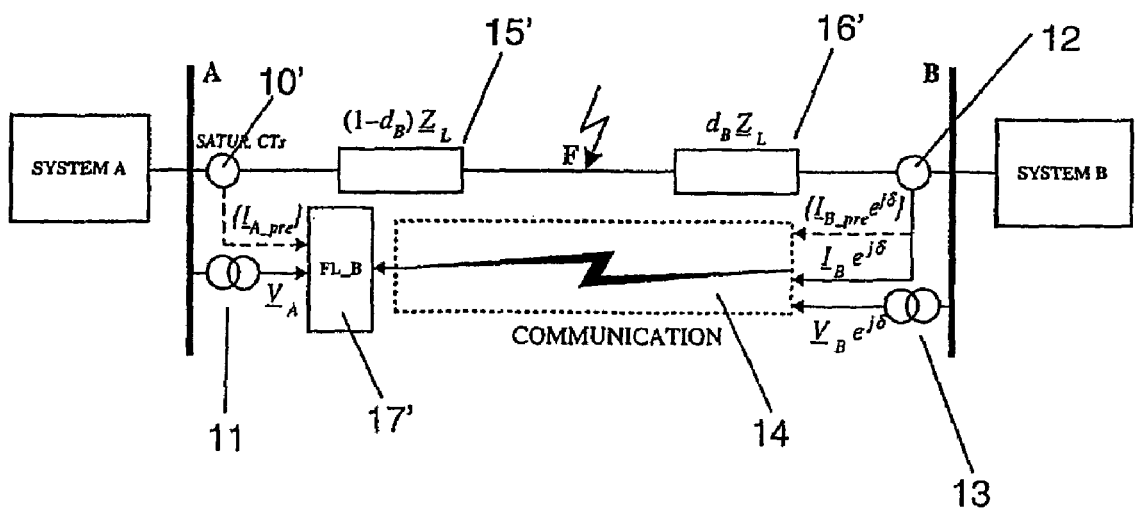
FIG. 3 shows a schematic diagram for a method for locating a fault as in FIG. 2 but in which a current transformer is saturated at A.

FIG. 3 shows the same arrangement essentially as in FIG. 2 but with one or more CTs 10' saturated at the A end, with pre fault currents and post-fault currents and post-fault voltages marked accordingly.

In FIG. 2 the CT 12 at the B end is saturated. The pre-fault current at B, $\underline{I}_{B\_pre}$ is disregarded, as indicated by the dotted line from the saturated CT 12 to the communication link 14.

FIG. 1 presents the concept of fault location when assuming saturation of CTs at one end of a section of a transmission line. Fault location is performed on the base of three phase voltages and currents from a substation at A ($\underline{V}_A$, $\underline{I}_A$) and from a substation at B ($\underline{V}_B$, $\underline{I}_B$). The method of fault location shown in FIG. 1, embodied as the fault locator procedure 17 shown in FIGS. 2, 3 may be carried out by a fault locator device 20 described below with reference to FIG. 19.

The term "CTs are saturated" is understood to mean: "at least one out of three CTs, installed at the particular end of a section of a transmission line, is saturated". Simultaneous magnetic saturation of CTs at both the terminals of a transmission line is assumed not to occur in a real transmission network.

The following cases with respect to saturation of one or more CTs have to be taken into account:
1. A CT is saturated at the side B—the fault location procedure FL_A, operating according to the proposed new method, has to be used, see FIG. 2.
2. A CT is saturated at the side A—the fault location procedure FL_B, operating according to the proposed new method, has to be used, see FIG. 3.
3. CTs are not saturated at both the sides of a transmission line—any of the fault location procedures FL_A or FL_B (operating according to the proposed new method) could be used. Referring to step 6 of FIG. 1. However, it is also possible to use any other one-end or two-end fault location algorithm in this case of no saturation. A two-end fault location method is disclosed in application SE 0004626-8 entitled Method and device of fault location. The method includes calculating a distance (d) to a fault using the positive sequence phasors, or positive sequence quantities of post fault current and voltage measurements made at both ends of a line. The information about what type of fault has occurred, see fault types in FIGS. 15, 16a, 16b, 17, 18a, 18b, may be used to determine which algorithm or part algorithm is used to calculate the distance to the fault. In the case when the fault is not a 3-phase balanced fault the distance (d) to a fault for example may also be calculated using the negative sequence quantities of post fault current and voltage measurements made at both ends of a line. In the case when the fault is a 3-phase balanced fault the distance (d) to the fault may, for example, be calculated using the incremental positive sequence quantities of current and voltage measurements made at both ends of a line. The particular incremental positive sequence component is understood as the difference between the post fault and the pre fault values. These methods may be used when it is determined that CTs are not saturated at both the sides of a transmission line to calculate distance to a fault as per step 6, FIG. 1.

A distance to fault, obtained in a particular case, is denoted here as:

$d_A$ [pu]—for the procedure FL_A used when CTs at the end B are saturated;

$d_B$ [pu]—for the procedure FL_B used when CTs at the end A are saturated;

d [pu]—for the case of no saturation of CTs at both the ends.

As shown in FIG. 1 there are two procedures FL_A and FL_B which may be carried out according to the present invention. These procedures are designated to locate faults under detection of saturation of CTs at the end B and the end A, respectively. Detailed principles of fault location with using FL_A and FL_B procedures are shown in FIG. 2 and 3, respectively. The fault locator procedure 17 is assumed here as carried out at the substation A. Required signals from the remote substation (B) are sent via the communication channel 14.

It is also possible to install the fault locator at the substation B. In this case the communication facility for sending signals from the substation A has to be provided. The proposed method of fault location itself does not depend on which the arrangement is actually applied.

The two-end fault location method provided is suitable for both synchronized and unsynchronized measurements. In case of providing synchronized measurements the sampled data from both the line terminals have naturally the common time base and thus the synchronization angle equals to zero ($\delta=0$).

In another embodiment of the invention, where in contrast to the first embodiment, the sampling at the line terminals is run unsynchronously. In this embodiment, the measured phasors do not have a common time base. In order to provide a such common base the synchronized angle ($\delta \neq 0$) has to be introduced. In this case, for unsynchronized measurements, the introduced synchronized angle may be any value and thus it has to be determined from the available measurements. For this purpose the fault locator procedure 17 has to be supplied with the pre-fault phase currents (FIG. 2, 3—shown as an input data of the fault locator that is marked with the dashed lines), which allow calculation of the synchronization angle.

The synchronization angle ($\delta$) is introduced in the form of an agent $e^{j\delta}$, which is multiplied by the phasors of phase voltages and currents acquired at a particular substation:

for the procedure FL_A (FIG. 2)—the phasors from the substation A are multiplied by $e^{j\delta}$, for the procedure FL_B (FIG. 3)—the phasors from the substation B are multiplied by $e^{j\delta}$.

The procedure FL_A (the case of saturation of CTs at the side B—FIG. 2 and FIG. 4) applies the following measurements of phasors:

for determining a distance to fault ($d_A$):

$\underline{I}_A$—post-fault currents from the side A from particular phases a, b, c:

$$\underline{I}_{A\_a}, \underline{I}_{A\_b}, \underline{I}_{A\_c}$$

$\underline{V}_A$—post-fault voltages from the side A from particular phases a, b, c:

$$\underline{V}_{A\_a}, \underline{V}_{A\_b}, \underline{V}_{A\_c}$$

$\underline{V}_B$—post-fault voltages from the side B from particular phases a, b, c:

$$\underline{V}_{B\_a}, \underline{V}_{B\_b}, \underline{V}_{B\_c}$$

for determining a synchronization angle ($\delta$) in case of no providing the synchronization of measurements (for synchronized measurements: $\delta=0$):

$\underline{I}_{A\_pre}$, pre-fault currents from the side A from particular phases a, b, c:

$$\underline{I}_{A\_pre\_a}, \underline{I}_{A\_pre\_b}, \underline{I}_{A\_pre\_c}$$

$\underline{I}_{B\_pre}$—pre-fault currents from the side B from particular phases a, b, c:

$$\underline{I}_{B\_pre\_a}, \underline{I}_{B\_pre\_b}, \underline{I}_{B\_pre\_c}$$

It follows by correspondence then that the procedure FL_B (the case of saturation of CTs at the side A—FIG. 3 and FIG. 5) applies the following measurements of phasors:

for determining a distance to fault ($d_B$):

$\underline{I}_B$—post-fault currents from the side B from particular phases a, b, c:

$$\underline{I}_{B\_a}, \underline{I}_{B\_b}, \underline{I}_{B\_c}$$

$\underline{V}_A$—post-fault voltages from the side A from particular phases a, b, c:

$$\underline{V}_{A\_a}, \underline{V}_{A\_b}, \underline{V}_{A\_c}$$

Figure 4:
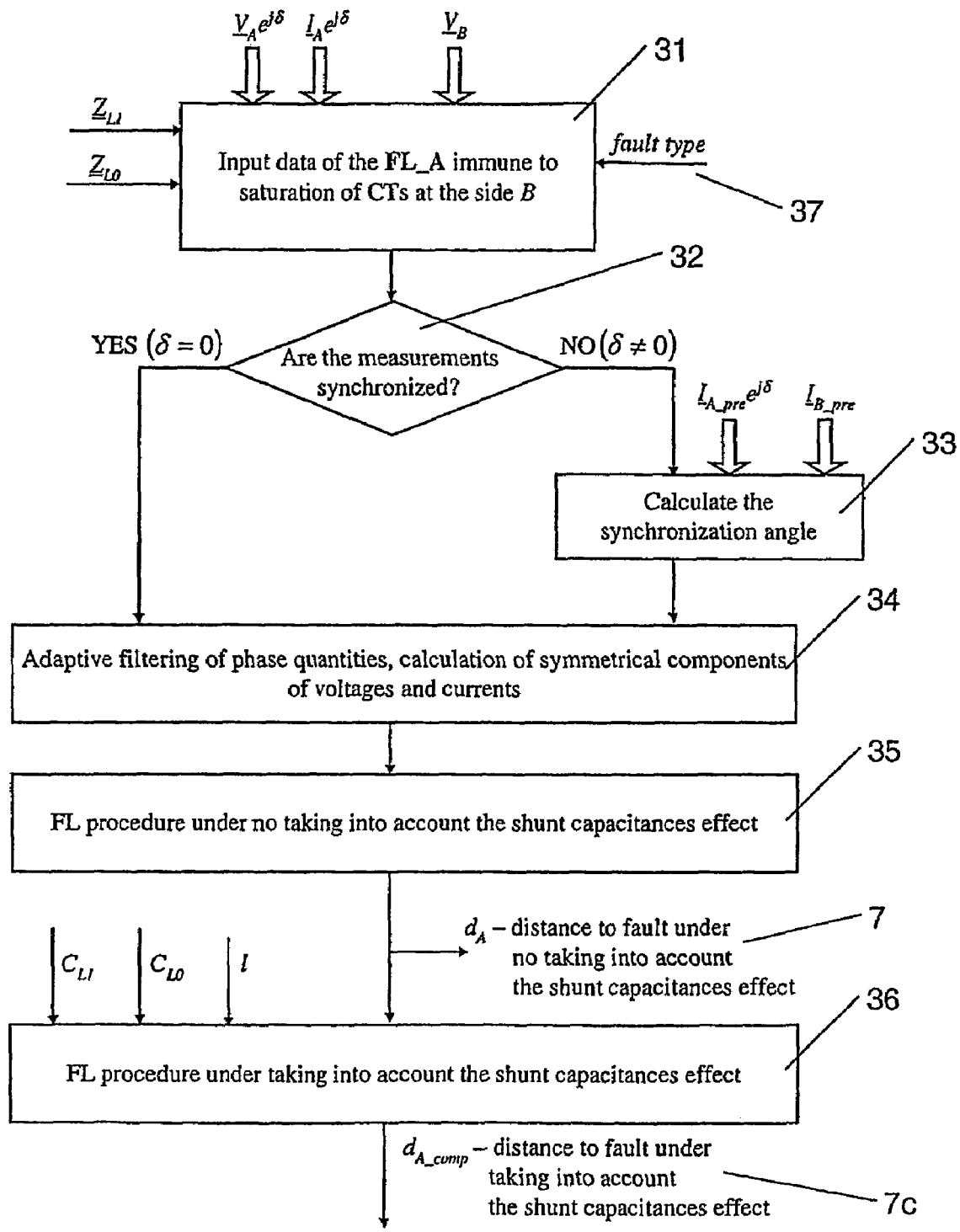
FIG. 4 shows a flowchart for a method for locating a fault during which a current transformer is saturated at B according to an embodiment of the invention.

$\underline{V}_B$—post-fault voltages from the side B from particular phases a, b, c:

$$\underline{V}_{B\_a}, \underline{V}_{B\_b}, \underline{V}_{B\_c}$$

for determining a synchronization angle (δ) in case of no provision for the synchronization of measurements (for synchronized measurements: δ=0):

$\underline{I}_{A\_pre}$—pre-fault currents from the side A from particular phases a, b, c:

$\underline{I}_{A\_pre\_a}, \underline{I}_{A\_pre\_b}, \underline{I}_{A\_pre\_c}$ $\underline{I}_{B\_pre}$—pre-fault currents from the side B from particular phases a, b, c:

$\underline{I}_{B\_pre\_a}, \underline{I}_{B\_pre\_b}, \underline{I}_{B\_pre\_c}$ Referring to FIG. 4. FIG. 4 shows in box 31 the input data, including current, voltage, line impedance measurements and a fault-type input. A decision step 32 determines if the measurements are synchronised. A decision of NO, (δ≠0), leads to the synchronisation angle (δ) being calculated in box 33. A decision of YES leads to box 34 for adaptive filtering of phase quantities, calculation of symmetrical components of voltages and currents. Box 35 calculates a value for location of the fault without taking into account shunt capacitance effects. The value, $d_A$, is available as a result 7 for distance to a fault.

Figure 5:
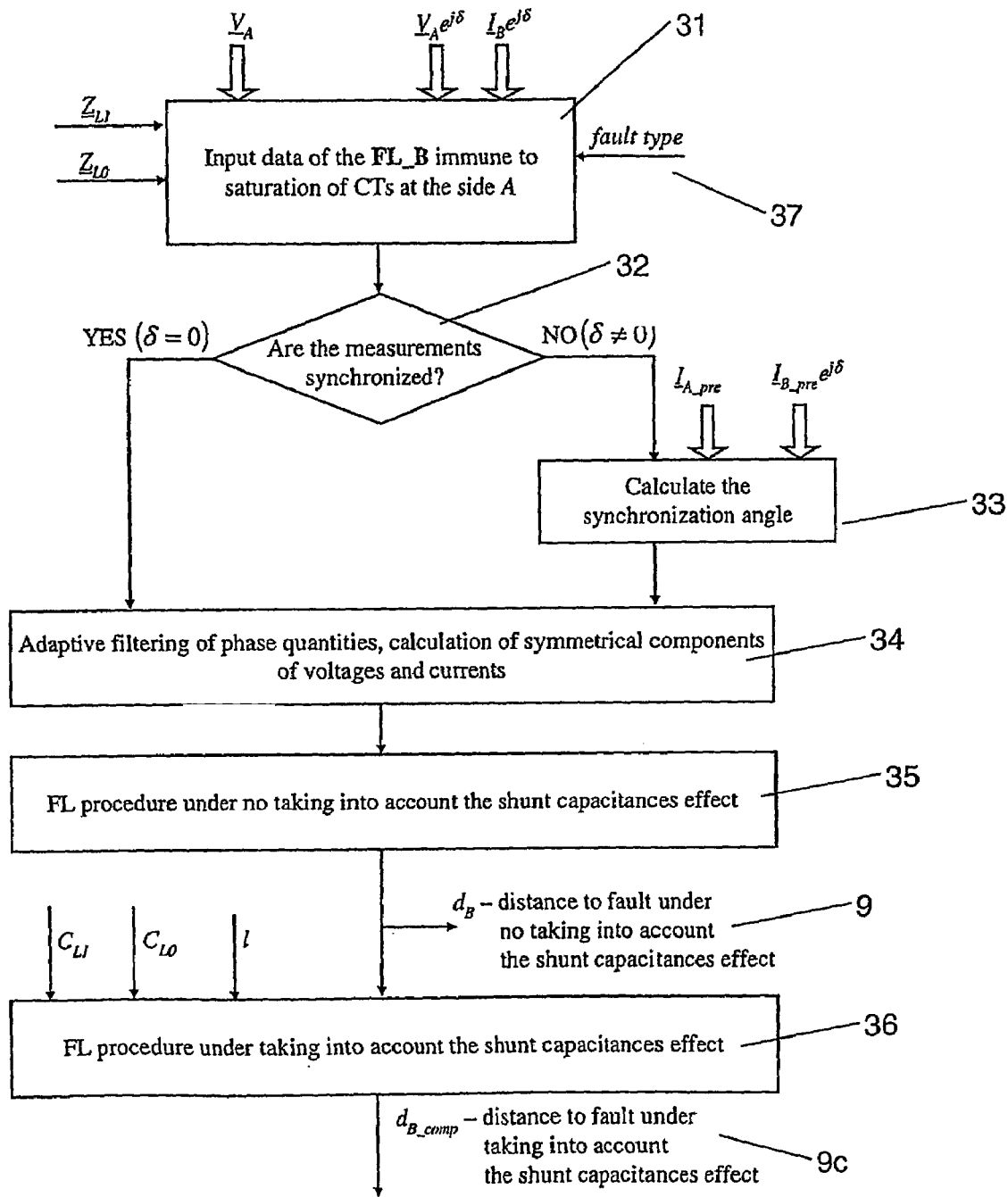
FIG. 5 shows a flowchart for the method of FIG. 4 but in which a current transformer is saturated at A.

In a further embodiment of the invention, Box 37 receives capacitance values and line length 1 as input and calculates a distance from A to a fault $d_{A\_comp}$ with compensation for shunt capacitance. FIG. 5 shows a corresponding diagram for the case when CTs are saturated at A and a distance from B to a fault $d_B$, is available at 7' and a distance to a fault with compensation for shunt capacitance $d_{B\_comp}$ is available at 9c.

Besides the above listed input signals described with reference to FIGS. 1–3, both the procedures (FL_A and FL_B) require the following parameters shown if FIG. 4, 5:

fault-type—this information can be provided from a protection system or a dedicated classification procedure can be incorporated, $Z_{L1}$—impedance of a whole line for the positive (negative) sequence, $Z_{L0}$—impedance of a whole line for the zero sequence l—line length (km)

$C_{L1}$—shunt capacitance of a whole line for the positive (negative) sequence $C_{L0}$—shunt capacitance of a whole line for the positive zero sequence.

Two of the last three parameters, (l, and $C_{L1}$ or $C_{L0}$) may be required for introducing the compensation for shunt capacitances of a transmission line (according to distributed long line model of Andersson [4]) in the further embodiment of the invention. Under an assumption that the positive sequence capacitance is identical to the negative sequence under pre-fault conditions a value either for $C_{L1}$ or $C_{L0}$ may be used. A distance to fault after the compensating for shunt capacitances is denoted as: $d_{A\_comp}$ (FIG. 4) and $d_{B\_comp}$ (FIG. 5), respectively.

Figure 6:
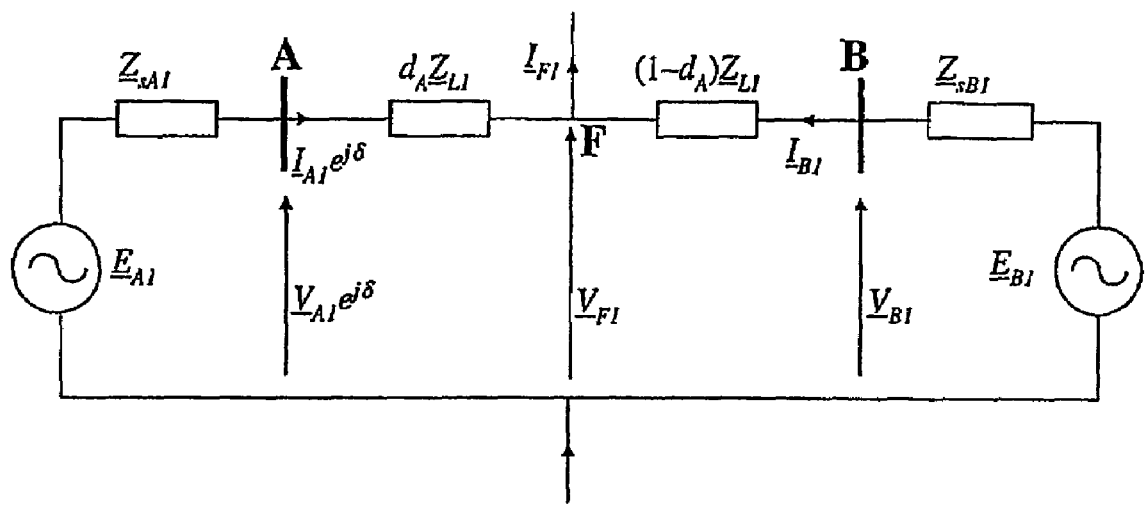
FIG. 6 shows a schematic diagram for an equivalent circuit for a section of a transmission line for a positive sequence component of a total fault current, during which fault a current transformer is saturated at B.
Figure 7:
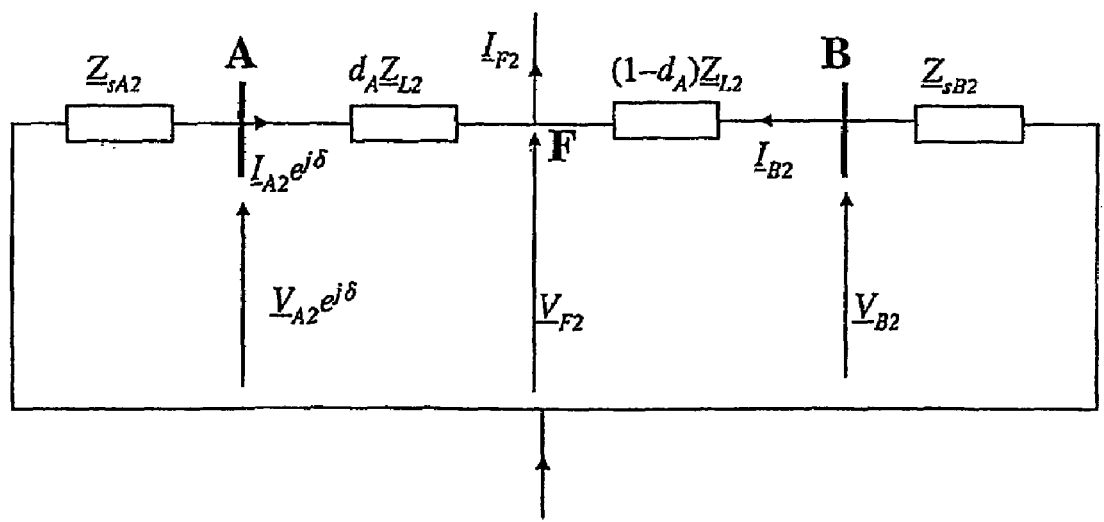
FIG. 7 shows a schematic diagram as in FIG. 6 but for the equivalent circuit for a negative sequence component of a total fault current.

In order to derive this location procedure (see FIG. 2, 4) the fault current distribution factors have to be considered. As it will be shown in details below, it is sufficient to consider these factors only for the positive and negative sequence. FIG. 6 presents the equivalent circuit diagram of a transmission line for the positive sequence, and FIG. 7 presents the equivalent circuit diagram for the negative sequence. At this stage of the derivation the shunt parameters of a line are neglected. The terminals of a line are denoted by A and B. The fault point is marked by F.

Positive sequence component of a total fault current (FIG. 6) is the following sum:

$$\underline{I}_{F1} = \underline{I}_{A1}e^{j\delta} + \underline{I}_{B1} \qquad (1)$$

Thus, positive sequence current $\underline{I}_{B1}$ can be expressed:

$$\underline{I}_{B1} = \underline{I}_{F1} - \underline{I}_{A1}e^{j\delta} \qquad (2)$$

Considering the voltage drop between the busbars A and B, with taking into account (2), we obtain:

$$\underline{V}_{A1}e^{j\delta} - d_A Z_{L1}\underline{I}_{A1}e^{j\delta} = \underline{V}_{B1} - (1-d_A)Z_{L1}(\underline{I}_{F1} - \underline{I}_{A1}e^{j\delta}) \qquad (3)$$

Fault current from (3) is determined as:

$$\underline{I}_{F1} = \frac{M_{1A}}{1 - d_A} \qquad (4)$$

where:

$$M_{1A} = \frac{-\underline{V}_{A1}e^{j\delta} + \underline{V}_{B1}}{Z_{L1}} + \underline{I}_{A1}e^{j\delta}$$

(δ)=synchronization angle, introduced for providing the common time base for measurements acquired at different ends of a transmission line.

Thus, positive sequence component of the total fault current is expressed by measurements from side A ($\underline{V}_{A1}, \underline{I}_{A1}$) and from side B ($\underline{V}_{B1}$-only). Measurements at the side B are taken here as the basis and thus measurements from the side A are taken into account with the synchronization angle (δ). In case of the synchronized measurements we have: δ=0. For the unsynchronized measurements this angle is unknown (δ≠0) and has to be determined by utilizing relations, which are valid for pre-fault currents or for post-fault currents but from the healthy phases. In further derivation this angle is treated as of the known value.

Analogously we have for the negative sequence (FIG. 7):

$$\underline{I}_{F2} = \frac{M_{2A}}{1 - d_A} \qquad (5)$$

where:

$$M_{2A} = \frac{-\underline{V}_{A2}e^{j\delta} + \underline{V}_{B2}}{Z_{L2}} + \underline{I}_{A2}e^{j\delta}$$

$Z_{L2} = Z_{L1}$—impedance of a line for the negative is the same as for the positive sequence.

Analogously we can determine the zero sequence component of the total fault current ($\underline{I}_{F0}$). However, this quantity will involve the impedance of a line for the zero sequence ($Z_{L0}$) Since this impedance ($Z_{L0}$) is considered as uncertain parameter, thus, $\underline{I}_{F0}$ is recommended as not to be used when representing the voltage drop across a fault resistance (this concept is taken from the fault locator presented in [1]).

The generalized fault loop model is utilized for deriving the considered fault location procedure. This is a single formula with the coefficients dependent on a fault type, covering different fault types. In words this formula may be written: [fault loop voltage] minus [voltage drop across the faulted segment of a line] minus [voltage drop across the fault resistance] equals zero. The actual formula is:

$$[a_1\underline{V}_{A1}e^{j\delta} + a_2\underline{V}_{A2}e^{j\delta} + a_0\underline{V}_{A0}e^{j\delta}] - \qquad (6)$$
$$\left[ d_A Z_{L1}\left(a_1\underline{I}_{A1}e^{j\delta} + a_2\underline{I}_{A2}e^{j\delta} + a_0\frac{Z_{L0}}{Z_{L1}}\underline{I}_{A0}e^{j\delta}\right)\right] + \ldots -$$

-continued $$\left[R_F\left(a_{F1}\frac{M_{1A}}{1-d_A} + a_{F2}\frac{M_{2A}}{1-d_A} + a_{F0}\frac{M_{0A}}{1-d_A}\right)\right] = 0$$

where: $\underline{a}_1, \underline{a}_2, \underline{a}_0, \underline{a}_{F1}, \underline{a}_{F2}, \underline{a}_{F0}$—the coefficients dependent on a fault type, gathered in TABLEs 1, 2. The derivation of the listed in the following Tables 1, 2 coefficients is presented in APPENDIX 1.

TABLE 1

Coefficients for determining fault loop signals defined.

| Fault type | $a_1$ | $a_2$ | $a_0$ |
|---|---|---|---|
| a–g | 1 | 1 | 1 |
| b–g | $a^2$ | a | 1 |
| c–g | a | $a^2$ | 1 |
| a–b, a–b–g | $1 - a^2$ | $1 - a$ | 0 |
| a–b–c, a–b–c–g | | | |
| b–c, b–c–g | $a^2 - a$ | $a - a^2$ | 0 |
| c–a, c–a–g | $a - 1$ | $a^2 - 1$ | 0 |
| | a = exp(j2π/3) | | |

TABLE 2

Alternative sets of the weighting coefficients from (5) for determining a voltage drop across the fault path resistance.

| Fault type | Set I | | | Set II | | | Set III | | |
|---|---|---|---|---|---|---|---|---|---|
| | $a_{F1}$ | $a_{F2}$ | $a_{F0}$ | $a_{F1}$ | $a_{F2}$ | $a_{F0}$ | $a_{F1}$ | $a_{F2}$ | $a_{F0}$ |
| a-g | 0 | 3 | 0 | 3 | 0 | 0 | 1.5 | 1.5 | 0 |
| b-g | 0 | 3a | 0 | $3a^2$ | 0 | 0 | $1.5a^2$ | 1.5a | 0 |
| c-g | 0 | $3a^2$ | 0 | 3a | 0 | 0 | 1.5a | $1.5a^2$ | 0 |
| a-b | 0 | $1 - a$ | 0 | $1 - a^2$ | 0 | 0 | $0.5(1 - a^2)$ | $0.5(1 - a)$ | 0 |
| b-c | 0 | $a - a^2$ | 0 | $a^2 - a$ | 0 | 0 | $0.5(a^2 - a)$ | $0.5(a - a^2)$ | 0 |
| c-a | 0 | $a^2 - 1$ | 0 | $a - 1$ | 0 | 0 | $0.5(a - 1)$ | $0.5(a^2 - 1)$ | 0 |
| a-b-g | $1 - a^2$ | $1 - a$ | 0 | $1 - a^2$ | $1 - a$ | 0 | $1 - a^2$ | $1 - a$ | 0 |
| b-c-g | $a^2 - a$ | $a - a^2$ | 0 | $a^2 - a$ | $a - a^2$ | 0 | $a^2 - a$ | $a - a^2$ | 0 |
| c-a-g | $a - 1$ | $a^2 - 1$ | 0 | $a - 1$ | $a^2 - 1$ | 0 | $a - 1$ | $a^2 - 1$ | 0 |
| a-b-c-g (a-b-c) | $1 - a^2$ | 0 | 0 | $1 - a^2$ | 0 | 0 | $1 - a^2$ | 0 | 0 |

Voltage drop across the fault path (as shown in the third term of equation (6)) is expressed using sequence components of the total fault current. The weighting coefficients ($\underline{a}_{F0}, \underline{a}_{F1}, \underline{a}_{F2}$) can accordingly be determined by taking the boundary conditions for a particular fault type. However, there is some freedom for that. Thus, it is proposed firstly to utilize this freedom for avoiding zero sequence quantities. This proposal has been taken since the zero sequence impedance of a line is considered as an unreliable parameter. Avoiding the zero sequence impedance of a line can be accomplished here by setting $\underline{a}_{F0}=0$ as shown in TABLE 2. Secondly, the freedom in establishing the weighting coefficients can be utilized for determining the preference for using particular quantities. Thus, the voltage drop across the fault path is expressed further with using positive and negative sequence quantities only (TABLE 2).

There are two unknowns: $d_A$, $R_F$ in equation (6). Note that the synchronization angle ($\delta$), as mentioned above, is known as:

$\delta=0$—for the synchronized measurements or $\delta\neq 0$—for the unsynchronized measurements;

where the synchronization angle is determined from the measurements (using pre-fault currents or post-fault currents but from the healthy phases).

Taking into account that in equation (6) we have adjusted $\underline{a}_{F0}=0$ and let us also write (6) in more compact form for further derivations:

$$\underline{A}_v - d_A Z_{L1} \underline{A}_i - \frac{R_F}{1 - d_A}[\underline{a}_{F1}M_{1A} + \underline{a}_{F2}M_{2A}] = 0 \quad (7)$$

where:

$$\underline{A}_v = \underline{a}_1 \underline{V}_{A1} e^{j\delta} + \underline{a}_2 \underline{V}_{A2} e^{j\delta} + \underline{a}_0 \underline{V}_{A0} e^{j\delta}$$

$$\underline{A}_i = \underline{a}_1 I_{A1} e^{j\delta} + \underline{a}_2 I_{A2} e^{j\delta} + \underline{a}_0 \frac{Z_{L0}}{Z_{L1}} I_{A0} e^{j\delta}$$

Separating equation (7) for real and imaginary parts we obtain:

$$\text{real}(\underline{A}_v) - d_A \text{real}(\underline{Z}_{1L}\underline{A}_i) - \frac{R_F}{1 - d_A}\text{real}(\underline{a}_{F1}M_{1A} + \underline{a}_{F2}M_{2A}) = 0 \quad (8a)$$

$$\text{imag}(\underline{A}_v) - d_A \text{imag}(Z_{1L}\underline{A}_i) - \frac{R_F}{1 - d_A}\text{imag}(\underline{a}_{F1}M_{1A} + \underline{a}_{F2}M_{2A}) = 0 \quad (8b)$$

Note, that in the above equations (8a), (8b) it was considered that:

$$\frac{R_F}{1 - d_A} -$$

is a real number

Multiplying (8a) by: imag($\underline{a}_{F1}M_{1A}+\underline{a}_{F2}M_{2A}$) and (8b) by: real($\underline{a}_{F1}M_{1A}+\underline{a}_{F2}M_{2A}$) we obtain:

$$\text{real}(\underline{A}_v)\text{imag}(\underline{a}_{F1}\underline{M}_{1A} + \underline{a}_{F2}\underline{M}_{2A}) - \qquad (9a)$$
$$d_A\text{real}(\underline{Z}_{L1}\underline{A}_i)\text{imag}(\underline{a}_{F1}\underline{M}_{1A} + \underline{a}_{F2}\underline{M}_{2A}) + \ldots \ldots -$$
$$\frac{R_F}{1-d_A}\text{real}(\underline{a}_{F1}\underline{M}_{1A} + \underline{a}_{F2}\underline{M}_{2A})\text{imag}(\underline{a}_{F1}\underline{M}_{1A} + \underline{a}_{F2}\underline{M}_{2A}) = 0$$

$$\text{imag}(\underline{A}_v)\text{real}(\underline{a}_{F1}\underline{M}_{1A} + \underline{a}_{F2}\underline{M}_{2A}) - \qquad (9b)$$
$$d_A\text{imag}(\underline{Z}_{L1}\underline{A}_i)\text{real}(\underline{a}_{F1}\underline{M}_{1A} + \underline{a}_{F2}\underline{M}_{2A}) + \ldots \ldots -$$
$$\frac{R_F}{1-d_A}\text{imag}(\underline{a}_{F1}\underline{M}_{1A} + \underline{a}_{F2}\underline{M}_{2A})\text{real}(\underline{a}_{F1}\underline{M}_{1A} + \underline{a}_{F2}\underline{M}_{2A}) = 0$$

Subtracting (9b) from (9a) we cancel fault resistance $R_F$ and obtain the solution for a distance to fault in the following form:

$$d_A = \frac{\text{real}(\underline{A}_v)\text{imag}(\underline{a}_{F1}\underline{M}_{1A} + \underline{a}_{F2}\underline{M}_{2A}) - \text{imag}(\underline{A}_v)\text{real}(\underline{a}_{F1}\underline{M}_{1A} + \underline{a}_{F2}\underline{M}_{2A})}{\text{real}(\underline{Z}_{L1}\underline{A}_i)\text{imag}(\underline{a}_{F1}\underline{M}_{1A} + \underline{a}_{F2}\underline{M}_{2A}) - \text{imag}(\underline{Z}_{L1}\underline{A}_i)\text{real}(\underline{a}_{F1}\underline{M}_{1A} + \underline{a}_{F2}\underline{M}_{2A})} \qquad (10)$$

where:

$$\underline{A}_v = a_1\underline{V}_{A1}e^{j\delta} + a_2\underline{V}_{A2}e^{j\delta} + a_0\underline{V}_{A0}e^{j\delta}$$

$$\underline{A}_i = a_1\underline{I}_{A1}e^{j\delta} + a_2\underline{I}_{A2}e^{j\delta} + a_0\frac{\underline{Z}_{L0}}{\underline{Z}_{L1}}\underline{I}_{A0}e^{j\delta}$$

$$\underline{M}_{1A} = \frac{-\underline{V}_{A1}e^{j\delta} + \underline{V}_{B1}}{\underline{Z}_{L1}} + \underline{I}_{A1}e^{j\delta}$$

$$\underline{M}_{2A} = \frac{-\underline{V}_{A2}e^{j\delta} + \underline{V}_{B2}}{\underline{Z}_{L1}} + \underline{I}_{A2}e^{j\delta}$$

$\underline{a}_1, \underline{a}_2, \underline{a}_0, \underline{a}_{F1}, \underline{a}_{F2}$—coefficients dependent on fault-type (TABLE 1, 2)

($\delta$)—synchronization angle.

Distance to a fault ($d_A$) according to (10) is determined under the condition of neglecting shunt capacitances of a transmission line. In case of short lines, say up to 150 km, it is sufficient for achieving high accuracy of fault location.

In a further embodiment of the invention and preferably for longer lines, the shunt capacitances effect may be compensated for. Otherwise, with lines of up to say 150 km and longer the location accuracy can be considerably deteriorated.

Compensation for a shunt capacitance effect of a line can be accomplished by taking into account the lumped $\pi$—model (lumped pi model) or the distributed long transmission line model. The distributed long line model, which provides greater accuracy of fault location, has been applied.

Fault location procedure with compensation for shunt capacitances of a transmission line requires the following additional input data, shown in FIG. 4:

$C_{L1}$—shunt capacitance of a whole line for the positive and the negative sequences (parameters of a line for the positive and the negative sequences are identical and thus: $C_{L2}=C_{L1}$)

$C_{L0}$ shunt capacitance of a whole line for the zero sequence, l—total line length (km).

The compensation of shunt capacitances is introduced while determining the voltage drop across the faulted line segment (in this example between points A and F)—the second term in the generalized fault loop model (6). This requires compensating the components of the measured currents for particular sequences. Thus, the original measured currents: $\underline{I}_{A1}$, $\underline{I}_{A2}$, $\underline{I}_{A0}$ have to be replaced by the currents after the introduced compensation: $\underline{I}_{A1\_comp}$, $\underline{I}_{A2\_comp}$, $\underline{I}_{A0\_comp}$. At the same time the original fault loop voltage (the first term in the model (6)) is taken for a distance to fault calculation. As concerns determining the voltage drop across the fault resistance (the third term in (6)), it is assumed here, which is a standard practice, that the effect of line capacitances at the fault location (point F) may be neglected. This is justified because the impedance of the capacitive branch at that location is much greater than the fault resistance. This means that the voltage drop across the fault resistance is determined without taking into account the shunt capacitances.

Using the above assumptions for the compensation of line capacitances the formula for a distance to fault (10) is modified to the following form:

$$d_{A\_comp} = \frac{\text{real}(\underline{A}_v)\text{imag}(\underline{a}_{F1}\underline{M}_{1A} + \underline{a}_{F2}\underline{M}_{2A}) - \text{imag}(\underline{A}_v)\text{real}(\underline{a}_{F1}\underline{M}_{1A} + \underline{a}_{F2}\underline{M}_{2A})}{\text{real}(\underline{Z}_{L1}^{long}\underline{A}_{i\_comp})\text{imag}(\underline{a}_{F1}\underline{M}_{1A} + \underline{a}_{F2}\underline{M}_{2A}) - \text{imag}(\underline{Z}_{L1}^{long}\underline{A}_{i\_comp})\text{real}(\underline{a}_{F1}\underline{M}_{1A} + \underline{a}_{F2}\underline{M}_{2A})} \qquad (11)$$

where:

$$\underline{A}_{i\_comp} = a_1\underline{I}_{A1\_comp}e^{j\delta} + a_2\underline{I}_{A2\_comp}e^{j\delta} + a_0\frac{\underline{Z}_{L0}^{long}}{\underline{Z}_{L1}^{long}}\underline{I}_{A0\_comp}e^{j\delta},$$

$\underline{I}_{A1\_comp}$, $\underline{I}_{A2\_comp}$, $\underline{I}_{A0\_comp}$—positive, negative and zero sequence currents after the compensation, $\underline{Z}_{L1}^{long}$—positive sequence impedance of a line with taking into account the distributed long line model (will be defined below at the point where the compensation for the currents will be presented), $\underline{Z}_{L0}^{long}$—as above, but for the zero sequence, the other quantities are defined in (10).

Figure 9:
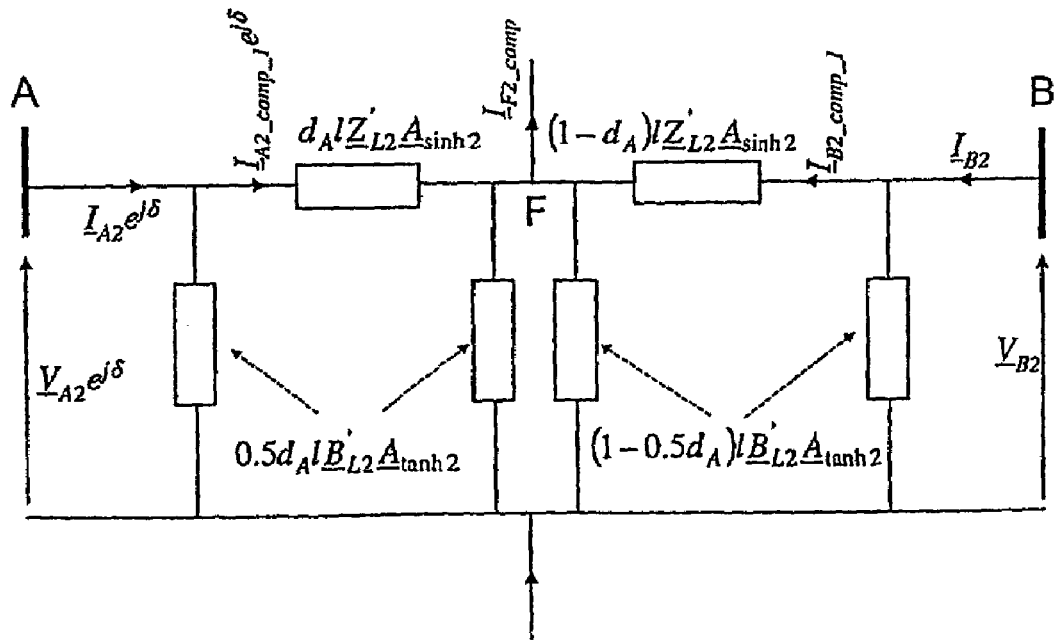
FIG. 9 shows a schematic diagram similar to FIG. 8 for a negative sequence circuit, with taking into account the shunt capacitances effect for a first iteration.
Figure 10:
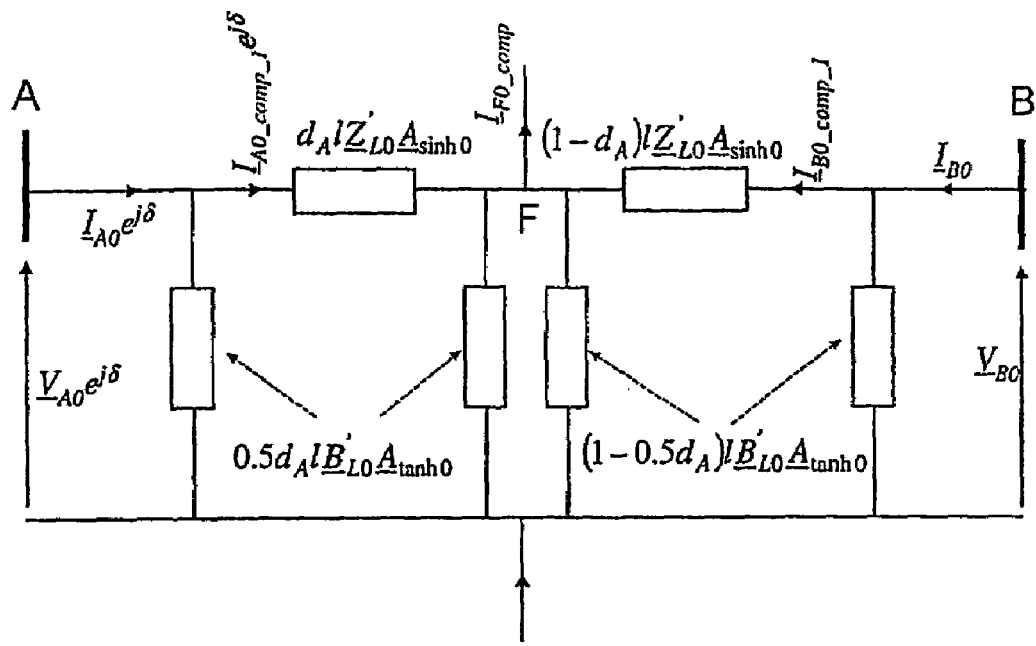
FIG. 10 shows a schematic diagram similar to FIG. 8, 9 for a zero sequence circuit, taking into account the shunt capacitances effect for a first iteration.

The compensation procedure requires iterative calculations, performed until the convergence is achieved (i.e. until the location estimates cease to change from the previous estimates). However, the studies conducted by the inventors revealed that results of acceptable accuracy are obtained using 2–3 iterations, thus a fixed number of iterations. The calculated distance to a fault from a particular (say, present iteration) is utilized for determining the shunt current in the next iteration. The determined shunt current is then deduced from the measured current. A distance to fault, calculated without considering the shunt effect (10), is taken as the starting value for the first iteration. The way of conducting the first iteration of the compensation is shown in FIGS. 8, 9, 10.

Figure 8:
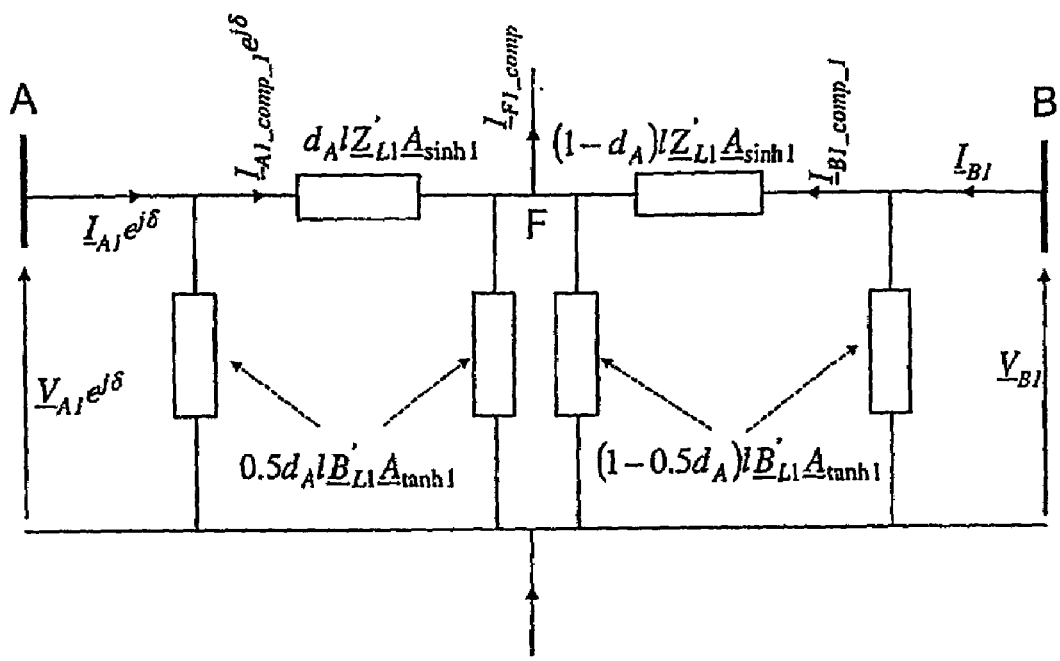
FIG. 8 shows a schematic diagram for an equivalent positive sequence circuit diagram for section A-B including taking into account the shunt capacitances effect for a first iteration according to another embodiment of the invention.

FIG. 8 is a diagram of a positive sequence circuit with taking into account the shunt capacitances effect for a first iteration. FIG. 9 is a negative sequence circuit diagram and FIG. 10 is a zero sequence circuit diagram each taking into account the shunt capacitances effect for a first iteration.

As a result of performing the first iteration for the positive sequence (FIG. 8) the compensated current ($\underline{I}_{A1\_comp\_1}$; the last index in the subscript denotes the first iteration) is calculated. This is based on deducing the shunt current from the original measured current ($\underline{I}_{A1}$):

$$\underline{I}_{A1\_comp\_1} = \underline{I}_{A1} - 0.5 d_A l \underline{B}'_{L1} \underline{A}_{tanh1} \underline{V}_{A1} \qquad (12)$$

where:

$d_A$—distance to fault calculated under no taking into account the shunt capacitance effect (10), l—total line length (km)

$$A_{\tanh 1} = \frac{\tanh\left(\sqrt{0.5 Z'_{L1} B'_{L1}}\, d_A l\right)}{\sqrt{0.5 Z'_{L1} B'_{L1}}\, d_A l}$$

$B'_{L1} = \dfrac{j\omega C_{L1}}{l}$ – positive sequence admittance (capacitive) of a line per km length (S/km)

$Z'_{L1} = \dfrac{Z_{L1}}{l}$ – positive sequence impedance of a line per km length (Ω/km)

Positive sequence impedance of a faulted line segment (between points A and F) without taking into account the shunt capacitances effect and using a simple R-L model, that is, a simple model excluding capacitance. For example such as a circuit equivalent to the circuit of FIG. 13 without the two capacitances equals:

$$d_A l Z'_{L1} \tag{13}$$

while for the distributed long line model:

$$d_A l Z'_{L1} A_{\sinh 1} \tag{14}$$

where:

$$A_{\sinh 1} = \frac{\sinh\left(\sqrt{Z'_{L1} B'_{L1}}\, d_A l\right)}{\sqrt{Z'_{L1} B'_{L1}}\, d_A l}$$

Thus, the positive sequence impedance of a line with taking into account the distributed long line model ($Z_{L1}^{long}$), which has to be used in the formula (11), equals:

$$Z_{L1}^{long} = A_{\sinh 1} Z_{L1} \tag{15}$$

As a result of performing the first iteration for the negative sequence, FIG. 9, the compensated current ($IA2\_{comp\_1}$; the last index in the subscript denotes the first iteration) is calculated. This is based on deducing the shunt current from the original measured current ($\underline{I}_{A2}$):

$$\underline{I}_{A2\_comp\_1} = \underline{I}_{A2} - 0.5 d_A l B'_{L2} A_{\tanh 2} \underline{V}_{A2} \tag{16}$$

where, taking into account that the line parameters for the positive and for the negative sequences are identical ($C_{L2}=C_{L1}$, $Z_{L2}=Z_{L1}$):

$A_{\tanh 2} = A_{\tanh 1}$ $B'_{L2} = B'_{L1}$

As a result of performing the first iteration for the zero sequence, FIG. 10, the compensated current ($IA0\_{comp\_1}$; the last index in the subscript denotes the first iteration) is calculated. This is based on deducing the shunt current from the original measured current ($\underline{I}_{A0}$):

$$I_{A0\_comp\_1} = I_{A0} - 0.5 d_A l B'_{L0} A_{\tanh 0} \underline{V}_{A0} \tag{17}$$

where:

$$A_{\tanh 0} = \frac{\tanh\left(\sqrt{0.5 Z'_{L0} B'_{L0}}\, d_A l\right)}{\sqrt{0.5 Z'_{L0} B'_{L0}}\, d_A l}$$

$B'_{L0} = \dfrac{j\omega C_{L0}}{l}$ – zero sequence admittance (capacitive) of a line per km length (S/km)

$Z'_{L0} = \dfrac{Z_{L0}}{l}$ – zero sequence impedance of a line per km length (Ω/km)

Figure 13:
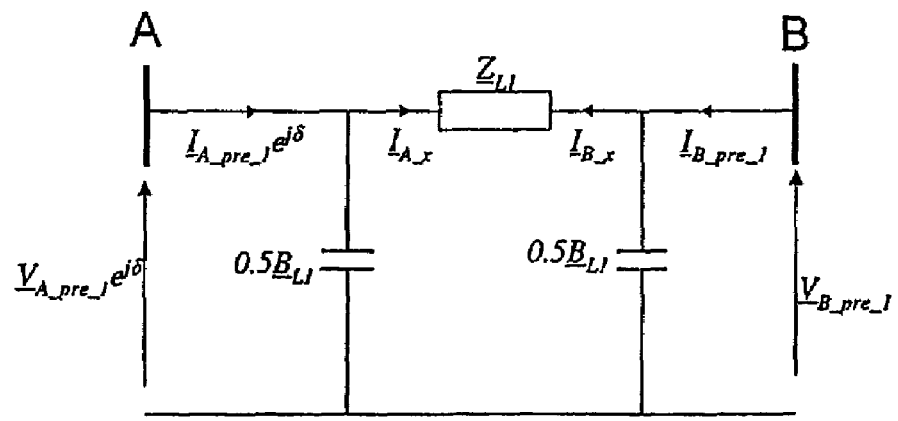
FIG. 13 shows a lumped π-model of a line for the pre-fault positive sequence of the current for the purpose of calculating a term related to the synchronisation angle ($\delta$), according to an embodiment of the invention.

Zero sequence impedance of a faulted line segment (between points A and F) without taking into account the shunt capacitances effect and considering the simple R-L model, described above such as a circuit equivalent to the circuit of FIG. 13 without the two capacitances:

$$d_A l Z'_{L0} \tag{18}$$

while for the distributed long line model:

$$d_A l Z'_{L0} A_{\sinh 0} \tag{19}$$

where:

$$A_{\sinh 0} = \frac{\sinh\left(\sqrt{Z'_{L0} B'_{L0}}\, d_A l\right)}{\sqrt{Z'_{L0} B'_{L0}}\, d_A l}$$

Thus, the zero sequence impedance of a line, taking into account the distributed long line model ($Z_{L0}^{long}$), which has to be used in the formula (11), equals:

$$Z_{L0}^{long} = A_{\sin 0} Z_{L0} \tag{20}$$

A method for a fault location according to the invention in the case where saturation occurs at the first line section end A begins with a calculation of the positive sequence component for FL_B.

Again, for deriving this location procedure (see FIGS. 3, 5) the fault current distribution factors have to be considered and also it is sufficient to consider these factors for the positive and negative sequence only. FIG. 8 presents the equivalent circuit diagram of a transmission line for the positive sequence, while FIG. 9 presents the equivalent circuit diagram for the negative sequence. At this stage of the derivation the shunt parameters of a line are also neglected.

Positive sequence component of a total fault current (FIG. 8) is the following sum:

$$\underline{I}_{F1} = \underline{I}_{B1} e^{j\delta} + \underline{I}_{A1} \tag{21}$$

Thus, positive sequence current $\underline{I}_{A1}$ can be expressed:

$$\underline{I}_{A1} = \underline{I}_{F1} - \underline{I}_{B1} e^{j\delta} \tag{22}$$

Considering the voltage drop between the busbars at B and A, with taking into account (22), we obtain:

$$\underline{V}_{B1} e^{j\delta} - d_B Z_{L1} \underline{I}_{B1} e^{j\delta} = \underline{V}_{A1} - (1 - d_B) Z_{L1} (\underline{I}_{F1} - \underline{I}_{B1} e^{j\delta}) \tag{23}$$

Fault current from (23) is determined as:

$$\underline{I}_{F1} = \frac{M_{1B}}{1 - d_B} \tag{24}$$

where:

$$M_{1B} = \frac{-\underline{V}_{B1} e^{j\delta} + \underline{V}_{A1}}{Z_{L1}} + \underline{I}_{B1} e^{j\delta}$$

($\delta$) is synchronization angle, introduced for providing the common time base for measurements acquired at different ends of a section of a transmission line.

Thus, positive sequence component of the total fault current is expressed by measurements from side B ($\underline{V}_{B1}$, $\underline{I}_{B1}$) and from side A ($\underline{V}_{A1}$-only). Measurements at the side A are taken here as the basis and thus measurements from the side B are taken into account with the synchronization angle ($\delta$).

Analogously we have for the negative sequence (FIG. 9):

$$\underline{I}_2 = \frac{M_{2B}}{1-d_B} \quad (25)$$

where:

$$M_{2B} = \frac{-\underline{V}_{B2} e^{j\delta} + \underline{V}_{A2}}{\underline{Z}_{L2}} + \underline{I}_{B2} e^{j\delta}$$

$\underline{Z}_{L2} = \underline{Z}_{L1}$—impedance of a line for the negative is the same as for the positive sequence.

Calculation of the zero sequence component. Analogously we can determine the zero sequence component of the total fault current ($\underline{I}_{F0}$). However, this quantity will involve the impedance of a line for the zero sequence ($\underline{Z}_{L0}$). Since this impedance ($\underline{Z}_{L0}$) is considered as uncertain parameter, thus, $\underline{I}_0$ is recommended as not to be used when representing the voltage drop across a fault resistance (this concept is taken from the original RANZA fault locator [1]).

The generalized fault loop model is utilized for deriving the fault location procedure FL_B considered here:

$$[\underline{a}_1 \underline{V}_{B1} e^{j\delta} + \underline{a}_2 \underline{V}_{B2} e^{j\delta} + \underline{a}_0 \underline{V}_{B0} e^{j\delta}] - \quad (26)$$
$$\left[d_B \underline{Z}_{L1}\left(\underline{a}_1 \underline{I}_{B1} e^{j\delta} + \underline{a}_2 \underline{I}_{B2} e^{j\delta} + \underline{a}_0 \frac{Z_{L0}}{Z_{L1}} \underline{I}_{B0} e^{j\delta}\right)\right] + \ldots - \left[R_F\left(\underline{a}_{F1} \frac{M_{1B}}{1-d_B} + \underline{a}_{F2} \frac{M_{2B}}{1-d_B} + \underline{a}_{F0} \frac{M_{0B}}{1-d_B}\right)\right] = 0$$

where:

$\underline{a}_1$, $\underline{a}_2$, $\underline{a}_0$, $\underline{a}_{F1}$, $\underline{a}_{F2}$, $\underline{a}_{F0}$—coefficients dependent on a fault type (TABLE 1, 2).

Voltage drop across the fault path (as shown in the third term of equation (16)) is expressed using sequence components of the total fault current. The weighting coefficients ($\underline{a}_{F0}$, $\underline{a}_{F1}$, $\underline{a}_{F2}$) can accordingly be determined by taking the boundary conditions for particular fault type. However, there is some freedom for that. Utilization of this freedom has been done in the same way as before for the procedure FL_A. Again it is assumed: $\underline{a}_{F0}=0$ There are two unknowns: $d_B$, $R_F$ in equation (26). Note that the synchronization angle ($\delta$), as mentioned at the beginning, is known:

$\delta=0$—for the synchronized measurements or $\delta \neq 0$—for the unsynchronized measurements; the synchronization angle is determined from the measurements (using pre-fault currents or post-fault currents but from the healthy phases).

Let us take into account that in (26) we have adjusted $\underline{a}_{F0}=0$ and let us also write (16) in more compact form for further derivations:

$$\underline{B}_v - d_B \underline{Z}_{L1} \underline{B}_i - \frac{R_F}{1-d_B}[\underline{a}_{F1} M_{1B} + \underline{a}_{F2} M_{2B}] = 0 \quad (27)$$

where:

$$\underline{B}_v = \underline{a}_1 \underline{V}_{B1} e^{j\delta} + \underline{a}_2 \underline{V}_{B2} e^{j\delta} + \underline{a}_0 \underline{V}_{B0} e^{j\delta}$$

$$\underline{B}_i = \underline{a}_1 \underline{I}_{B1} e^{j\delta} + \underline{a}_2 \underline{I}_{B2} e^{j\delta} + \underline{a}_0 \frac{Z_{L0}}{Z_{L1}} \underline{I}_{B0} e^{j\delta}$$

Separating (27) for real and imaginary parts we obtain:

$$\text{real}(\underline{B}_v) - d_B \text{ real}(\underline{Z}_{1L} \underline{B}_i) - \frac{R_F}{1-d_B} \text{ real}(\underline{a}_{F1} M_{1B} + \underline{a}_{F2} M_{2B}) = 0 \quad (28a)$$

$$\text{imag}(\underline{B}_v) - d_B \text{ imag}(\underline{Z}_{1L} \underline{B}_i) - \frac{R_F}{1-d_B} \text{ imag}(\underline{a}_{F1} M_{1B} + \underline{a}_{F2} M_{2B}) = 0 \quad (28b)$$

Note, that in the above equations (28a), (28b) it was considered that:

$$\frac{R_F}{1-d_B} -$$

is a real number.

Multiplying (28a) by: $\text{imag}(\underline{a}_{F1} M_{1B} + \underline{a}_{F2} M_{2B})$ and (28b) by: $\text{real}(\underline{a}_{F1} M_{1B} + \underline{a}_{F2} M_{2B})$ we obtain:

$$\text{real}(\underline{B}_v) \text{ imag}(\underline{a}_{F1} M_{1B} + \underline{a}_{F2} M_{2B}) - \quad (29a)$$
$$d_B \text{ real}(\underline{Z}_{L1} \underline{B}_i) \text{ imag}(\underline{a}_{F1} M_{1B} + \underline{a}_{F2} M_{2B}) + \ldots -$$
$$\frac{R_F}{1-d_B} \text{ real}(\underline{a}_{F1} M_{1B} + \underline{a}_{F2} M_{2B}) \text{imag}(\underline{a}_{F1} M_{1B} + \underline{a}_{F2} M_{2B}) = 0$$

$$\text{imag}(\underline{B}_v) \text{ real}(\underline{a}_{F1} M_{1B} + \underline{a}_{F2} M_{2B}) - \quad (29b)$$
$$d_B \text{ imag}(\underline{Z}_{L1} \underline{B}_i) \text{ real}(\underline{a}_{F1} M_{1B} + \underline{a}_{F2} M_{2B}) + \ldots -$$
$$\frac{R_F}{1-d_B} \text{ imag}(\underline{a}_{F1} M_{1B} + \underline{a}_{F2} M_{2B}) \text{real}(\underline{a}_{F1} M_{1B} + \underline{a}_{F2} M_{2B}) = 0$$

Subtracting (29b) from (29a) we cancel fault resistance $R_F$ and obtain the solution for a distance to fault in the following form:

$$d_B = \frac{\text{real}(\underline{B}_v) \text{ imag}(\underline{a}_{F1} M_{1B} + \underline{a}_{F2} M_{2B}) - \text{imag}(\underline{B}_v) \text{ real}(\underline{a}_{F1} M_{1B} + \underline{a}_{F2} M_{2B})}{\text{real}(\underline{Z}_{L1} \underline{B}_i) \text{ imag}(\underline{a}_{F1} M_{1B} + \underline{a}_{F2} M_{2B}) - \text{imag}(\underline{Z}_{L1} \underline{B}_i) \text{ real}(\underline{a}_{F1} M_{1B} + \underline{a}_{F2} M_{2B})} \quad (30)$$

where:

$$\underline{B}_v = \underline{a}_1 \underline{V}_{B1} e^{j\delta} + \underline{a}_2 \underline{V}_{B2} e^{j\delta} + \underline{a}_0 \underline{V}_{B0} e^{j\delta}$$

$$\underline{B}_i = \underline{a}_1 \underline{I}_{B1} e^{j\delta} + \underline{a}_2 \underline{I}_{B2} e^{j\delta} + \underline{a}_0 \frac{Z_{L0}}{Z_{L1}} \underline{I}_{B0} e^{j\delta}$$

-continued $$\underline{M}_{1B} = \frac{-\underline{V}_{B1}e^{j\delta} + \underline{V}_{A1}}{\underline{Z}_{L1}} + \underline{I}_{B1}e^{j\delta}$$

$$\underline{M}_{2B} = \frac{-\underline{V}_{B2}e^{j\delta} + \underline{V}_{A2}}{\underline{Z}_{L1}} + \underline{I}_{B2}e^{j\delta}$$

$\underline{a}_1, \underline{a}_2, \underline{a}_0, \underline{a}_{F1}, \underline{a}_{F2}$—coefficients dependent on a fault-type (TABLE 1, 2)

($\delta$)—synchronization angle.

Compensation for shunt capacitance effects to calculate a compensated value for $d_B$ i.e. a value for $d_{B\text{-}comp}$ can be accomplished analogously to the method presented for the procedure FL_A above.

The derived fault location procedures FL_A (10) and FL_B (20) require having the measurements from the line terminals related to the common time base. In case of the synchronized measurements it is provided automatically. In contrast, for the unsynchronized measurements the synchronization angle ($\delta\neq0$) plays this role. The introduced synchronization angle for the unsynchronized measurements is unknown and thus has to be calculated from the available measurements. To be more precise, there is a need for calculating the term $e^{j\delta}$ and not the synchronization angle ($\delta$) itself. This is so since the phasors of the symmetrical components are processed in the location procedures.

The synchronization, i.e. calculating the term $e^{j\delta}$ can be performed by utilizing pre-fault measurements.

FIG. 13 shows a lumped π model of a line for the pre-fault positive sequence including the shunt capacitances The required term $e^{j\delta}$ can be calculated by considering the relations valid for the pre-fault conditions. For this purpose the shunt capacitances of a transmission line have to be taken into account, see FIG. 13. Note that for the shunt branches shown in FIG. 13 the admittances ($0.5\underline{B}_{L1}$) and thus not impedances are indicated, where: $\underline{B}_{L1}=j\omega_1 C_{L1}$; $C_{L1}$—positive sequence shunt capacitance of the whole line.

Figure 14:
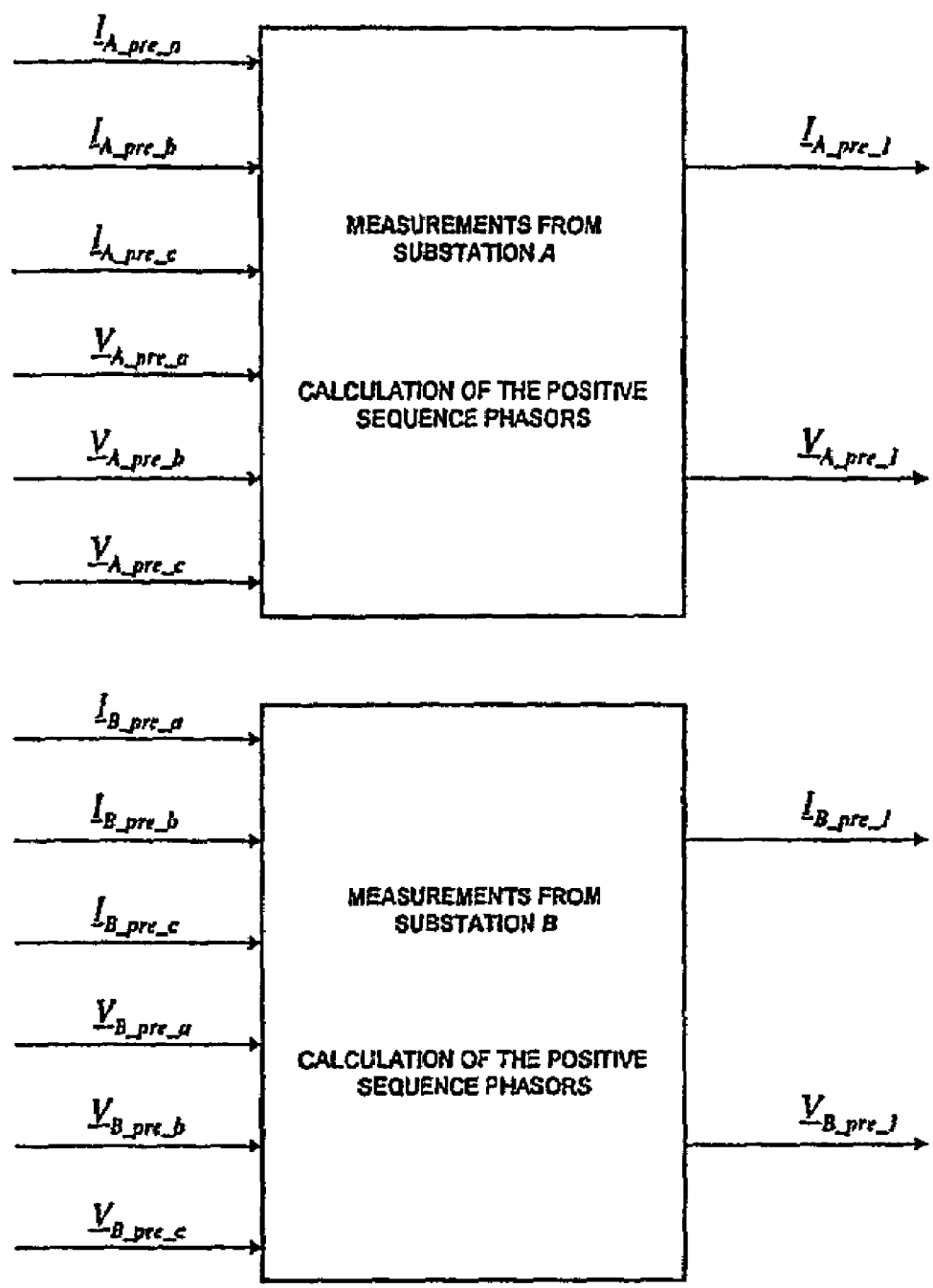
FIG. 14 shows a block diagram for a calculation of the positive sequence phasors dependent on measurements from each end of the section A and B respectively.
Figure 15:
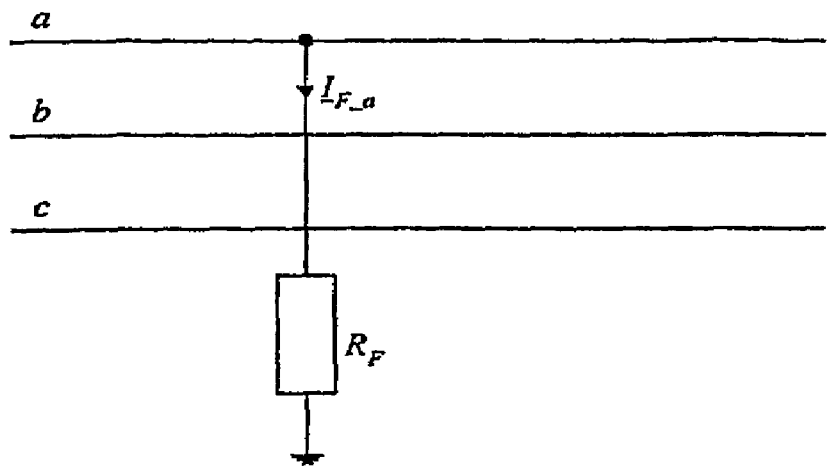
FIGS. 15, 16a, 16b, 17, 18a, 18b show schematic diagrams of possible fault-types with respect to derivation of coefficients for Table 1A, Table 2 in Appendix 1.

FIG. 14 is a diagram for the determination of the positive sequence phasors for the pre-fault phase currents and voltages acquired at the substations A and B.

Figure 11:
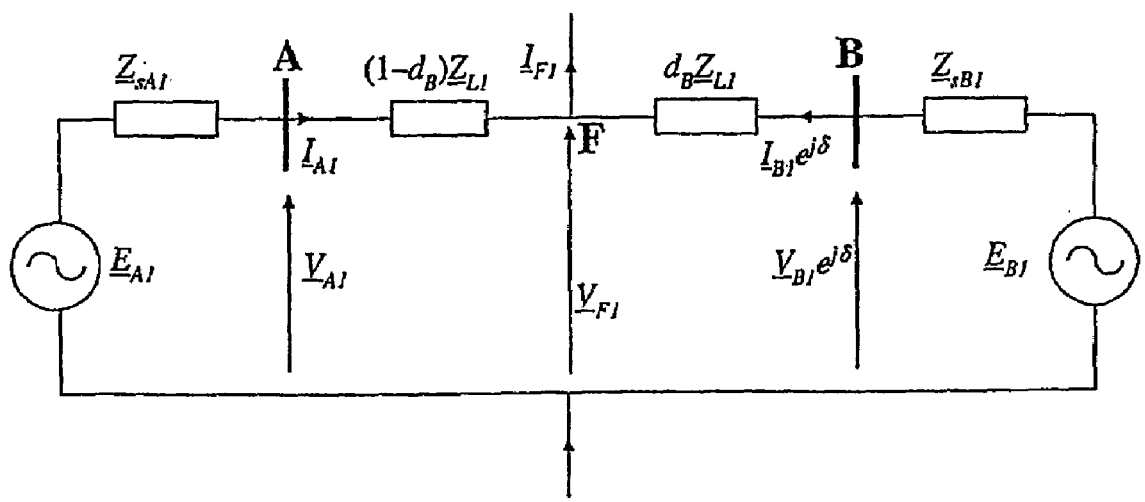
FIG. 11 shows a schematic diagram for an equivalent circuit for a section of a transmission line for a positive sequence component of a total fault current, during which fault a current transformer is saturated at A.
Figure 12:
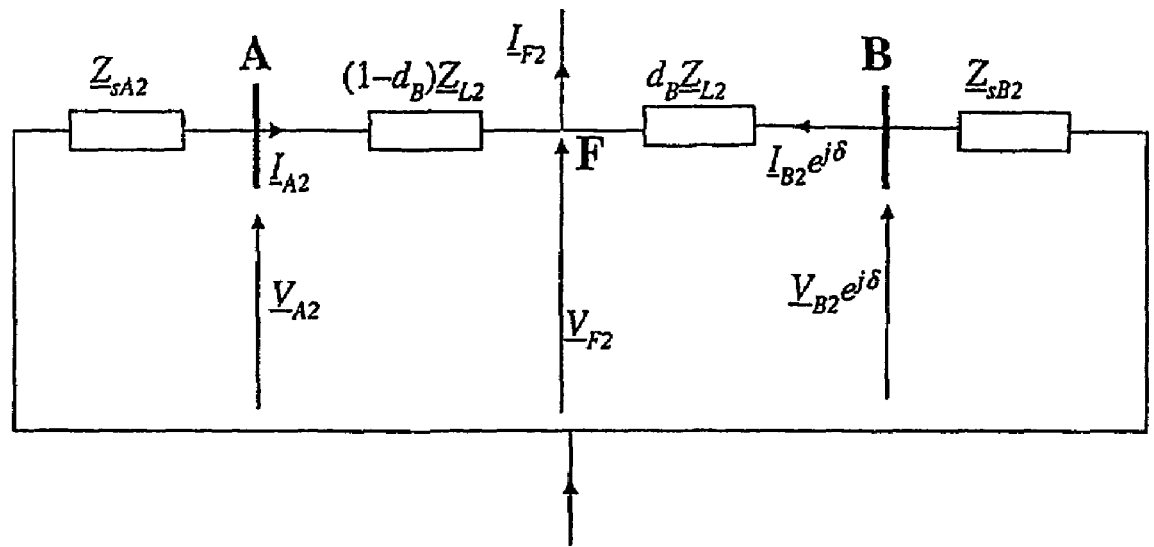
FIG. 12 shows a schematic diagram as in FIG. 11 but for the equivalent circuit for a negative sequence component of a total fault current.

In order to determine the value of $e^{j\delta}$ the computation starts from calculating positive sequence phasors of the pre-fault phase voltages and currents acquired at the sub-stations A and B, see FIG. 14. For example, taking the pre-fault currents from phases (a, b, c) at the station A ($\underline{I}_{A\_pre\_a}, \underline{I}_{A\_pre\_b}, \underline{I}_{A\_pre\_c}$) the positive sequence phasor ($\underline{I}_{A\_pre\_1}$) is calculated. Analogously the phase voltages from the station A as well as for the phase currents and voltages from the substation is for B (FIG. 11).

The value of the synchronization angle ($\delta$) is calculated from the following condition:

$$\underline{I}_{A\_x} = -\underline{I}_{B\_x} \tag{31}$$

where:

$$\underline{V}_{A\_pre\_1}e^{j\delta}$$

$$\underline{I}_{B\_B\_x} = \underline{I}_{B\_pre\_1} - j0.5\omega_1 C_{L1}\underline{V}_{B\_pre\_1}$$

From (31) one obtains:

$$e^{j\delta} = \frac{-\underline{I}_{B\_pre\_1} + j0.5\omega_1 C_{L1}\underline{V}_{B\_pre\_1}}{\underline{I}_{A\_pre\_1} - j0.5\omega_1 C_{L1}\underline{V}_{A\_pre\_1}} \tag{32}$$

A more precise value of the synchronization angle can be obtained by using a long line model (with distributed parameters).

The method and a fault locator device according to any embodiment of the invention may be used to determine distance to a fault on a section of power transmission line. The present invention may also be used to determine a distance to a fault on a section of a power distribution line, or any other line or bus arranged for any of generation, transmission, distribution, control or consumption of electrical power.

Figure 19:
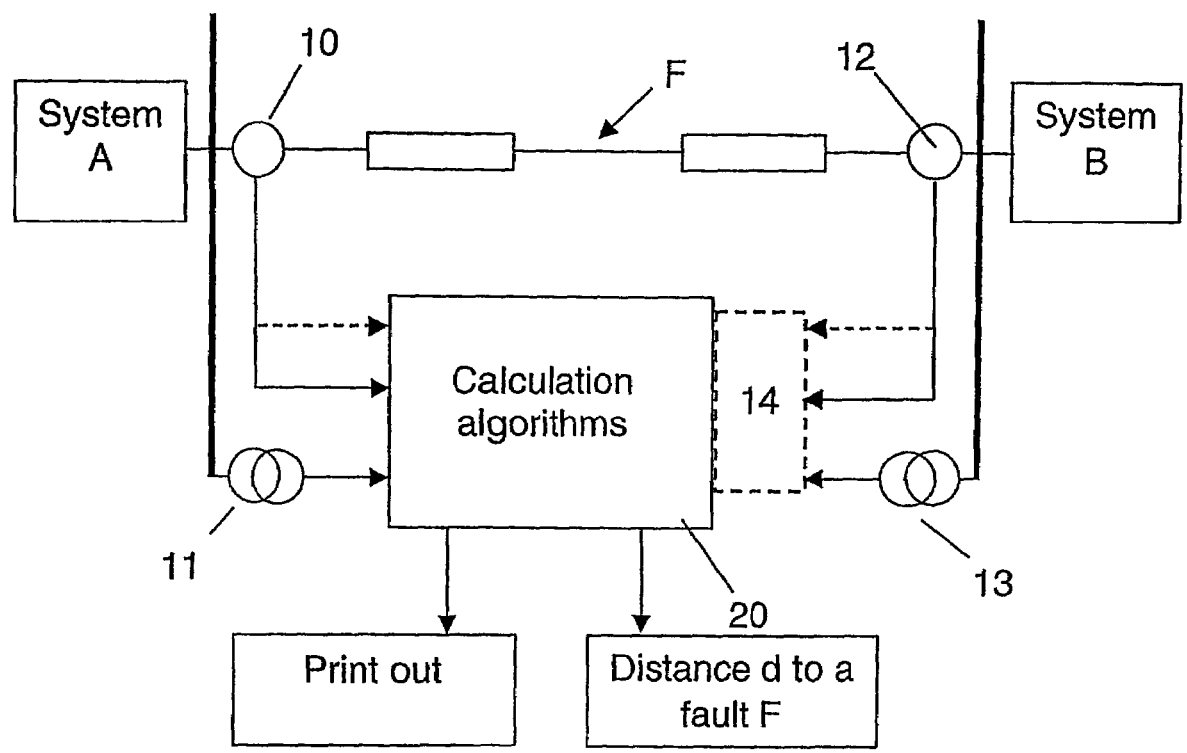
FIG. 19 shows details of a fault locator device according to an embodiment of the invention.

FIG. 19 shows an embodiment of a device for determining the distance from one end, A or B, of a section of transmission line, to a fault F on the transmission line according to the described method. The device and system comprises certain measuring devices such as current measuring means 10, 12, voltage measurement means 11, 13, measurement value converters, members for treatment of the calculating algorithms of the method, indicating means for the calculated distance to fault and a printer for printout of the calculated fault.

In the embodiment shown, measuring devices 10 and 12 for continuous measurement of all the phase currents, and measuring devices 11, 13 for measurement of voltages, are arranged in both stations A and B. The measured values $\underline{V}_A$, $\underline{I}_A$, $\underline{V}_B$, $\underline{I}_B$ are all passed to a calculating unit 20, filtered and stored. The calculating unit is provided with the calculating algorithms described, programmed for the processes needed for calculating the distance to fault. In FIG. 19 the high speed communication means 14 is shown arranged in respect of receiving communications from section end B, but could as well be arranged in respect of section end A instead. The calculating unit 20 contains means (such as a means for carrying out a procedure described in EP 506 035B1 described above) for determining whether a CT is saturated or not. The calculating unit 20 is provided with pre-fault phase currents and also with known values such as shunt capacitances and the impedances of the line. In respect of the occurrence of a fault, information regarding the type of fault may be supplied to the calculating unit. When the calculating unit has determined the distance to fault, it is displayed on the device and/or sent to remotely located display means. A printout of the result may also be provided. In addition to signaling the fault distance, the device can produce reports, in which are recorded measured values of the currents of both lines, voltages, type of fault and other measured and/or calculated information associated with a given fault at a distance. Information about a fault and its location may be automatically notified to operational network centres or to automatically start calculations such as to: determine journey time to location;
select which repair crew shall be dispatched to site;
estimate possible time taken to execute a repair;
propose alternative arrangements for power supply;
select which vehicles or crew member may be needed;
estimate how many shifts work per crew will be required, and the like actions.

The fault locator device and system may comprise filters for filtering the signals, converters for sampling the signals and one or more micro computers. The micro processor (or processors) comprises one or more central processing units (CPU) performing the steps of the method according to the invention. This is performed with the aid of a dedicated computer program, which is stored in the program memory. It is to be understood that the computer program may also be run on one or more general purpose industrial computers or microprocessors instead of a specially adapted computer.

The software includes computer program code elements or software code portions that make the computer perform the method using equations, algorithms, data and calculations previously described. A part of the program may be stored in a processor as above, but also in a ROM, RAM, PROM or EPROM chip or similar. The program in part or in whole may also be stored on, or in, other suitable computer readable medium such as a magnetic disk, CD-ROM or DVD disk, hard disk, magneto-optical memory storage means, in volatile memory, in flash memory, as firmware, or stored on a data server.

A computer program product according to an aspect of the invention may be stored at least in part on different mediums that are computer readable. Archive copies may be stored on standard magnetic disks, hard drives, CD or DVD disks, or magnetic tape. The databases and libraries are stored preferably on one or more local or remote data servers, but the computer program products may, for example at different times, be stored in any of; a volatile Random Access memory (RAM) of a computer or processor, a hard drive, an optical or magneto-optical drive, or in a type of non-volatile memory such as a ROM, PROM, or EPROM device. The computer program product may also be arranged in part as a distributed application capable of running on several different computers or computer systems at more or less the same time.

It is also noted that while the above describes exemplifying embodiments of the invention, there are several variations and modifications which may be made to the disclosed solution without departing from the scope of the present invention as defined in the appended claims.

REFERENCES

[1] ERIKSSON L., SAHA M. M., ROCKEFELLER G. D., *An accurate fault locator with compensation for apparent reactance in the fault resistance resulting from remote-end infeed*, IEEE Transactions on Power Apparatus and Systems, Vol. PAS-104, No. 2, February 1985, pp. 424–436.

[2] NOVOSEL D., HART D. G., UDREN E., GARITTY J., *Unsynchronized two-terminal fault location estimation*, IEEE Transactions on Power Delivery, Vol. 11, No. 1, January 1996, pp. 130–138.

[3] TZIOUVARAS D. A., ROBERTS J., BENMMOUYAL G., *New multi-ended fault location design for two-or three-terminal lines*, Proceedings of Seventh International Conference on Developments in Power System Protection, Conference Publication No. 479, IEE 201, pp. 395–398.

[4] ANDERSON P. M., *Power system protection*, McGraw-Hill, 1999.

Appendix 1—Derivation of the Coefficients from Tables 1, 2

In classic distance relaying or in the RANZA fault locator [1] the phase quantities are used for determining the fault loop voltages. Similarly, phase currents, but compensated for the zero sequence current (in case of single phase-to-ground faults) are used for defining the fault loop currents. This method is marked in TABLE 1A as the classic approach. In contrast, in the description of the new fault location algorithm the fault loop signals (both, voltage and current) are defined in terms of symmetrical quantities (the symmetrical components approach—in TABLE 1A). Both, the classic and symmetrical approaches are equivalent to each other. However, the applied here symmetrical components approach is better since it enables to use the generalized fault loop model, what leads to obtaining the single formula for a distance to fault, covering different fault types (appropriate coefficients, relevant for a particular fault type are used). Moreover, the applied symmetrical components approach enables to perform the compensation for shunt capacitances individually for all the sequence quantities.

TABLE IA

Fault loop voltage ($\underline{V}_{A\_FL}$) and current ($\underline{I}_{A\_FL}$) defined by using the classic and symmetrical components approaches.

| | The classic approach | | The symmetrical components approach $\underline{V}_{A\_FL} = \underline{a}_1 \underline{V}_{A1} + \underline{a}_2 \underline{V}_{A2} + \underline{a}_0 \underline{V}_{A0}$ $\underline{I}_{A\_FL} = \underline{a}_1 \underline{I}_{A1} + \underline{a}_2 \underline{I}_{A2} + \underline{a}_0 \frac{Z_{0L}}{Z_{1L}} \underline{I}_{A0}$ | | |
|---|---|---|---|---|---|
| Fault type | $\underline{V}_{A\_FL}$ | $\underline{I}_{A\_FL}$ | $\underline{a}_1$ | $\underline{a}_2$ | $\underline{a}_0$ |
| a-g | $\underline{V}_{A\_a}$ | $\underline{I}_{A\_a} + \underline{k}_0 \underline{I}_{A0}$ | 1 | 1 | 1 |
| b-g | $\underline{V}_{A\_b}$ | $\underline{I}_{A\_b} + \underline{k}_0 \underline{I}_{A0}$ | $\underline{a}^2$ | $\underline{a}$ | 1 |
| c-g | $\underline{V}_{A\_c}$ | $\underline{I}_{A\_c} + \underline{k}_0 \underline{I}_{A0}$ | $\underline{a}$ | $\underline{a}^2$ | 1 |
| a-b, a-b-g a-b-c a-b-c-g | $\underline{V}_{A\_a} - \underline{V}_{A\_b}$ | $\underline{I}_{A\_a} - \underline{I}_{A\_b}$ | $1 - \underline{a}^2$ | $1 - \underline{a}$ | 0 |
| b-c, b-c-g | $\underline{V}_{A\_b} - \underline{V}_{A\_c}$ | $\underline{I}_{A\_b} - \underline{I}_{A\_c}$ | $\underline{a}^2 - \underline{a}$ | $\underline{a} - \underline{a}^2$ | 0 |
| c-a, c-a-g | $\underline{V}_{A\_c} - \underline{V}_{A\_a}$ | $\underline{I}_{A\_c} - \underline{I}_{A\_a}$ | $\underline{a} - 1$ | $\underline{a}^2 - 1$ | 0 |

The signals are defined for the fault loop seen from the substation A $$\underline{k}_0 = \frac{\underline{Z}_{L0} - \underline{Z}_{L1}}{\underline{Z}_{L1}} \qquad \underline{a} = \exp(j2\pi/3)$$

EXAMPLES OF THE DERIVATION OF THE COEFFICIENTS $\underline{a}_1, \underline{a}_2, \underline{a}_0$

1. Single phase-to-ground fault: a–g fault $$\underline{I}_{A\_FL} = \underline{V}_{A\_a} = \underline{V}_{A1} + \underline{V}_{A2} + \underline{V}_{A0} = \underline{a}_1 \underline{V}_{A1} + \underline{a}_2 \underline{V}_{A2} + \underline{a}_0 \underline{V}_{A0}$$

$$\underline{I}_{A\_FL} = \underline{I}_{A\_a} + \underline{k}_0 \underline{I}_{A0}$$

-continued $$= \underline{I}_{A1} + \underline{I}_{A2} \underline{I}_{A0} + \frac{\underline{Z}_{L0} - \underline{Z}_{L1}}{\underline{Z}_{L1}} \underline{I}_{A0}$$

$$= \underline{I}_{A1} + \underline{I}_{A2} + \frac{\underline{Z}_{L0}}{\underline{Z}_{L1}} \underline{I}_{A0} =$$

$$= \underline{a}_1 \underline{I}_{A1} + \underline{a}_2 \underline{I}_{A2} + \underline{a}_0 \frac{\underline{Z}_{L0}}{\underline{Z}_{L1}} \underline{I}_{A0}$$

Thus: $\underline{a}_1 = \underline{a}_2 = \underline{a}_0 = 1$

2. Inter-phase faults: a–g, a-b-g, a-b-c, a-b-c-g faults $$\underline{V}_{A\_FL} = \underline{V}_{A\_a} - \underline{V}_{A\_b}$$
$$= (\underline{V}_{A1} + \underline{V}_{A2} + \underline{V}_{A0}) - (\underline{a}^2 \underline{V}_{A1} + \underline{a} \underline{V}_{A2} + \underline{V}_{A0})$$
$$= (1 - \underline{a}^2)\underline{V}_{A1} + (1 - \underline{a})\underline{V}_{A2} =$$
$$= \underline{a}_1 \underline{V}_{A1} + \underline{a}_2 \underline{V}_{A2} + \underline{a}_0 \underline{V}_{A0}$$

$$\underline{I}_{A\_FL} = \underline{I}_{A\_a} - \underline{I}_{A\_b}$$
$$= (\underline{I}_{A1} + \underline{I}_{A2} + \underline{I}_{A0}) - (\underline{a}^2 \underline{I}_{A1} + \underline{a} \underline{I}_{A2} + \underline{I}_{A0})$$
$$= (1 - \underline{a}^2)\underline{I}_{A1} + (1 - \underline{a})\underline{I}_{A2} =$$
$$= \underline{a}_1 \underline{I}_{A1} + \underline{a}_2 \underline{I}_{A2} + \underline{a}_0 \frac{\underline{Z}_{L0}}{\underline{Z}_{L1}} \underline{I}_{A0}$$

Thus: $\underline{a}_1 = 1 - \alpha^2$, $\underline{a}_2 = 1 - \alpha$, $\underline{a}_1 = 0$ TABLE 2 contains three alternative sets (Set I, Set II, Set III) of the weighting coefficients, which are used for determining a voltage drop across a fault path. The coefficients are calculated from the boundary conditions—relevant for a particular fault type. It is distinctive that in all the sets the zero sequence is omitted ($\underline{a}_{F0}=0$). It is advantages since the zero sequence impedance of a line is considered as the uncertain parameter. By setting $\underline{a}_{F0}=0$ we limit adverse influence of the uncertainty with respect to the zero sequence impedance data upon the fault location accuracy. To be precise one has to note that this limitation is of course partial since it is related only to determining the voltage drop across a fault path. In contrast, while determining the voltage drop across a faulted line segment the zero sequence impedance of the line is used.

TABLE 2

Alternative sets of the weighting coefficients from (5) for determining a voltage drop across the fault path resistance

| Fault type | Set I | | | Set II | | | Set III | | |
|---|---|---|---|---|---|---|---|---|---|
| | $a_{F1}$ | $a_{F2}$ | $a_{F0}$ | $a_{F1}$ | $a_{F2}$ | $a_{F0}$ | $a_{F1}$ | $a_{F2}$ | $a_{F0}$ |
| a-g | 0 | 3 | 0 | 3 | 0 | 0 | 1.5 | 1.5 | 0 |
| b-g | 0 | 3a | 0 | $3a^2$ | 0 | 0 | $1.5a^2$ | $1.5a$ | 0 |
| c-g | 0 | $3a^2$ | 0 | $3a$ | 0 | 0 | $1.5a$ | $1.5a^2$ | 0 |
| a-b | 0 | $1 - a$ | 0 | $1 - a^2$ | 0 | 0 | $0.5(1 - a^2)$ | $0.5(1 - a)$ | 0 |
| b-c | 0 | $a - a^2$ | 0 | $a^2 - a$ | 0 | 0 | $0.5(a^2 - a)$ | $0.5(a - a^2)$ | 0 |
| c-a | 0 | $a^2 - 1$ | 0 | $a - 1$ | 0 | 0 | $0.5(a - 1)$ | $0.5(a^2 - 1)$ | 0 |
| a-b-g | $1 - a^2$ | $1 - a$ | 0 | $1 - a^2$ | $1 - a$ | 0 | $1 - a^2$ | $1 - a$ | 0 |
| b-c-g | $a^2 - a$ | $a - a^2$ | 0 | $a^2 - a$ | $a - a^2$ | 0 | $a^2 - a$ | $a - a^2$ | 0 |
| c-a-g | $a - 1$ | $a^2 - 1$ | 0 | $a - 1$ | $a^2 - 1$ | 0 | $a - 1$ | $a^2 - 1$ | 0 |
| a-b-c-g (a-b-c) | $1 - a^2$ | 0 | 0 | $1 - a^2$ | 0 | 0 | $1 - a^2$ | 0 | 0 |

EXAMPLES OF THE DERIVATION OF THE COEFFICIENTS $\underline{a}_{F1}, \underline{a}_{F2}, \underline{a}_{F0}$

FIG. 15, a–g Fault

Taking into account that in the healthy phases: $\underline{I}_{F\_b} = \underline{I}_{F\_c} = 0$ this gives:

$$\underline{I}_{F1} = \frac{1}{3}(\underline{I}_{F\_a} + \underline{a}\underline{I}_{F\_b} + \underline{a}^2\underline{I}_{F\_c})$$
$$= \frac{1}{3}(\underline{I}_{F\_a} + \underline{a}0 + \underline{a}^2 0)$$
$$= \frac{1}{3}\underline{I}_{F\_a}$$

$$\underline{I}_{F2} = \frac{1}{3}(\underline{I}_{F\_a} + \underline{a}^2\underline{I}_{F\_b} + \underline{a}\underline{I}_{F\_c})$$
$$= \frac{1}{3}(\underline{I}_{F\_a} + \underline{a}^2 0 + \underline{a}0)$$
$$= \frac{1}{3}\underline{I}_{F\_a}$$

$$\underline{I}_{F0} = \frac{1}{3}(\underline{I}_{F\_a} + \underline{I}_{F\_b} + \underline{I}_{F\_c})$$
$$= \frac{1}{3}(\underline{I}_{Fa} + 0 + 0)$$
$$= \frac{1}{3}\underline{I}_{F\_a}$$

The sequence components are related: $\underline{I}_{F1} = \underline{I}_{F2} = \underline{I}_{F0}$ and finally: $\underline{I}_F = \underline{I}_{F\_a} = 3\underline{I}_{F2}$, thus: $\underline{a}_{F1} = 0$, $\underline{a}_F = 3$, $\underline{a}_F = 0$ (as in the SET I from Table 2)

or $I_F = I_{F\_a} = 3I_{F1}$, thus: $\alpha_{F1}=3, \alpha_{F2}=0, \alpha_F=0$ (as in the SET II from Table 2)

or $I_F = I_{F\_a} = 1,5I_{F1} + 1,5I_{F2}$, thus: $\alpha_{F1}=1,5, \alpha_{F2}=1,5, \alpha_F=0$ (as in the SET III from Table 2)

Figure 16A:
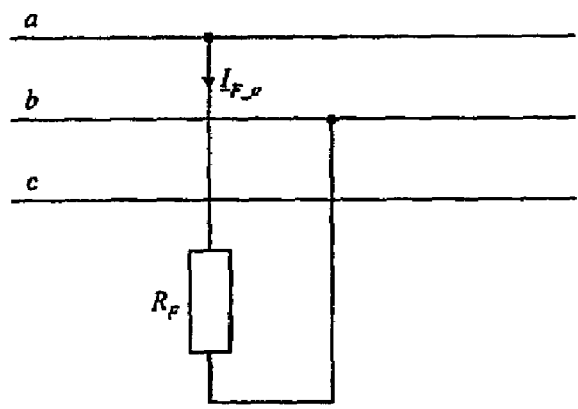
Figure 16B:
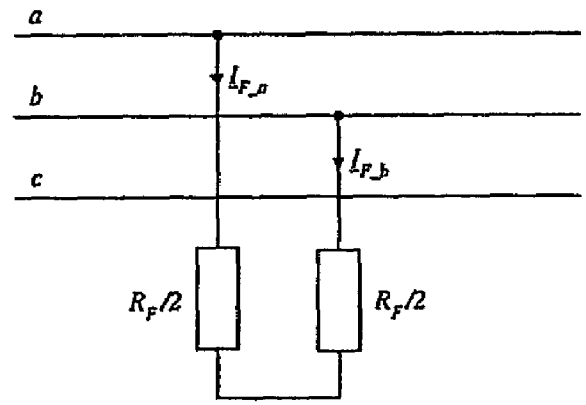

FIG. 16a, 16b a–b Fault:

The fault current can be expressed as: $I_F = I_{F\_a}$ or as:

$$I_F = \frac{1}{2}(I_{F\_a} - I_{F\_b})$$

Taking into account that in the healthy phase: $IF_{\_c}=0$ and for the faulted phases: $I_{F\_b} = -I_{F\_a}$, this gives:

$$I_{F1} = \frac{1}{3}(I_{F\_a} + \underline{a}I_{F\_b} + \underline{a}^2 I_{F\_c})$$
$$= \frac{1}{3}(I_{F\_a} + \underline{a}(-I_{F\_a}) + \underline{a}^2 0)$$
$$= \frac{1}{3}(1 - \underline{a})I_{F\_a}$$

$$I_{F2} = \frac{1}{3}(I_{F\_a} + \underline{a}^2 I_{F\_b} + \underline{a}I_{F\_c})$$
$$= \frac{1}{3}(I_{F\_a} + \underline{a}^2(-I_{F\_a}) + \underline{a}0)$$
$$= \frac{1}{3}(1 - \underline{a}^2)I_{F\_a}$$

$$I_{F0} = \frac{1}{3}(I_{F\_a} + I_{F\_b} + I_{F\_c})$$
$$= \frac{1}{3}(I_{F\_a} + (-I_{F\_a}) + 0)$$
$$= 0$$

The relation between $I_{F1}$ and $I_{F2}$ is thus:

$$\frac{I_{F1}}{I_{F2}} = \frac{\frac{1}{3}(1-\underline{a})I_{F\_a}}{\frac{1}{3}(1-\underline{a}^2)I_{F\_a}} = \frac{(1-\underline{a})}{(1-\underline{a}^2)}$$

Finally:

$$I_F = I_{F\_a} = \frac{3}{(1-\underline{a}^2)}I_{F2} = (1-\underline{a})I_{F2}$$

thus: $\alpha_{F1}=0, \alpha_{F2}=1-\alpha, \alpha_{F0}=0$ (as in the SET I from Table 2)

or $$I_F = I_{F\_a} = \frac{3}{(1-\underline{a})}I_{F1} = (1-\underline{a}^2)I_{F1}$$

thus: $\alpha_{F1}=1-\alpha^2, \alpha_{F2}=0, \alpha_{F0}=0$ (as in the SET II from Table 2) or $$I_F = 0,5I_{F\_a} + 0,5I_{F\_a} = \frac{1,5}{(1-\underline{a}^2)}I_{F2} + \frac{1,5}{(1-\underline{a})}I_{F1} = 0,$$

$$5(1-\underline{a})I_{F2} + 0,5(1-\underline{a}^2)I_{F1}$$

thus: $\alpha_{F1}=0,5(1-\alpha^2), \alpha_{F2}=0,5(1-\alpha), \alpha_{F0}=0$ (as in the SET III from Table 2)

Figure 17:
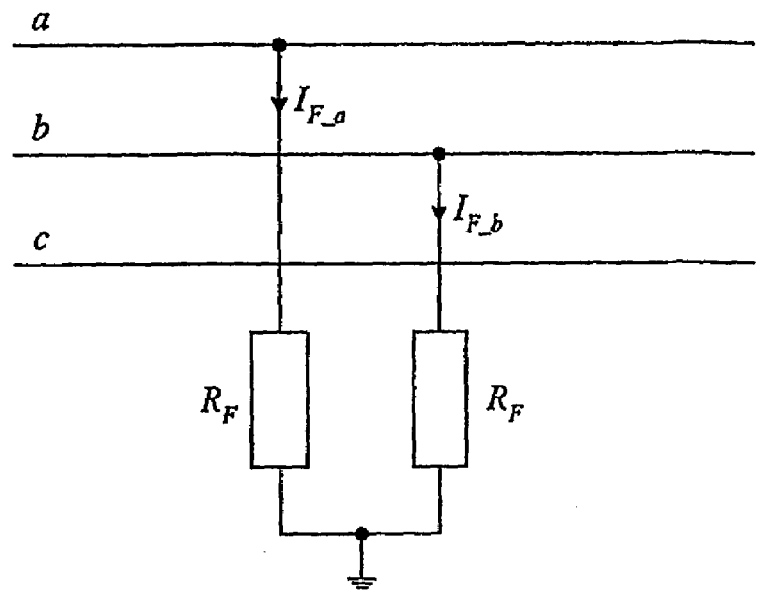

See FIG. 17, (a-b-g) Fault:

$$I_F = I_{F\_a} - I_{F\_b}$$
$$= (I_{F1} + I_{F2} + I_{F0}) - (\underline{a}^2 I_{F1} + \underline{a}I_{F2} + I_{F0}) =$$
$$= (1-\underline{a}^2)I_{F1} + (1-\underline{a})I_{F2}$$

Thus: $\alpha_{F1}=1-\alpha^2, \alpha_{F2}=1-\alpha, \alpha_{F0}=0$ (as in the SETs I, II, III from Table 2)

Figure 18A:
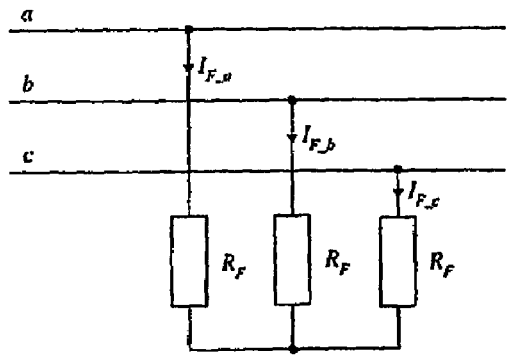
Figure 18B:
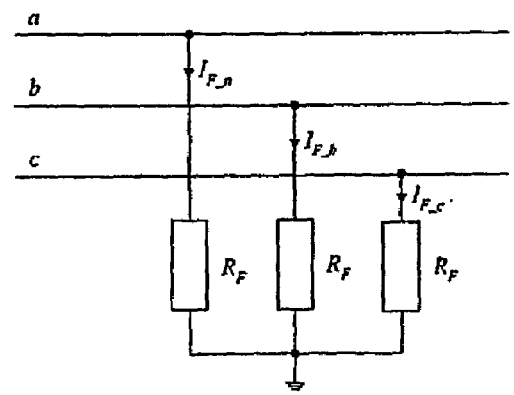

See FIG. 18a, 18b, (a-b-c) or (a-b-c-g) Symmetrical Faults:

Taking the first two phases (a, b) for composing the voltage drop across a fault path one obtains:

$$I_F = I_{F\_a} - I_{F\_b}$$
$$= (I_{F1} + I_{F2} + I_{F0}) - (\underline{a}^2 I_{F1} + \underline{a}I_{F2} + I_{F0}) =$$
$$= (1-\underline{a}^2)I_{F1} + (1-\underline{a})I_{F2}$$

Thus:

$\alpha_{F1}=1-\alpha^2, \alpha_{F2}=1-\alpha, \alpha_{F0=0}$

Additionally, if a fault is ideally symmetrical the positive sequence is the only component, which is present in the signals. Therefore, we have:

$\alpha_{F1}=1-\alpha^2, \alpha_{F2}=0, \alpha_{F0}=0$ (as in the SETs I, II, III from Table 2).

What is claimed is:

1. A method to locate a fault in a section of a transmission line using measurements of current and voltage at a first end and a second end of said section, the method comprising after the occurrence of a fault along the section:

receiving post-fault phase voltages and post fault phase currents from each of said first end and said second end;

determining whether a current transformer at said first end is saturated;

determining whether a current transformer at said second end is saturated; and locating the fault by calculating a distance to said fault using the post-fault phase voltages and by using only the post-fault phase currents from one of the first end and the second end where no current transformer is saturated; and providing the calculation result on a computer readable medium.

2. The method according to claim 1, wherein the distance to a fault is calculated by means of a formula:

$$d_A = \frac{\text{real}(\underline{A}_v)\,\text{imag}(a_{F1}\underline{M}_{1A} + a_{F2}\underline{M}_{2A}) - \text{imag}(\underline{A}_v)\,\text{real}(a_{F1}\underline{M}_{1A} + a_{F2}\underline{M}_{2A})}{\text{real}(\underline{Z}_{L1}\underline{A}_i)\,\text{imag}(a_{F1}\underline{M}_{1A} + a_{F2}\underline{M}_{2A}) - \text{imag}(\underline{Z}_{L1}\underline{A}_i)\,\text{real}(a_{F1}\underline{M}_{1A} + a_{F2}\underline{M}_{2A})}$$

where:

$$\underline{A}_v = a_1\underline{V}_{A1}e^{j\delta} + a_2\underline{V}_{A2}e^{j\delta} + a_0\underline{V}_{A0}e^{j\delta}$$

$$\underline{A}_i = a_1\underline{I}_{A1}e^{j\delta} + a_2\underline{I}_{A2}e^{j\delta} + a_0\frac{\underline{Z}_{L0}}{\underline{Z}_{L1}}\underline{I}_{A0}e^{j\delta}$$

$$\underline{M}_{1A} = \frac{-\underline{V}_{A1}e^{j\delta} + \underline{V}_{B1}}{\underline{Z}_{L1}} + \underline{I}_{A1}e^{j\delta}$$

$$\underline{M}_{2A} = \frac{-\underline{V}_{A2}e^{j\delta} + \underline{V}_{B2}}{\underline{Z}_{L1}} + \underline{I}_{A2}e^{j\delta}$$

$\underline{Z}_{L1}$—impedance of a whole line for the positive (negative) sequence, l—total line length, $\alpha_1, \alpha_2, \alpha_0, \alpha_{F1}, \alpha_{F2}$—are coefficients dependent on a fault type, wherein the distance to a fault $d_B$ is calculated by means of a corresponding formula by substituting the values measured at end A with values measured at end B and vice versa.

3. The method according to claim 1, further comprising calculating in the case of a non-zero synchronisation angle $\delta \neq 0$ a value for a term $e^{j\delta}$ using a formula:

$$e^{j\delta} = \frac{-\underline{I}_{B\_pre\_1} + j0.5\omega_1 C_{L1}\underline{V}_{B\_pre\_1}}{\underline{I}_{A\_pre\_1} - j0.5\omega_1 C_{L1}\underline{V}_{A\_pre\_1}}$$

where:

$$\underline{I}_{A\_x} = \underline{I}_{A\_pre\_1}e^{j\delta} - j0.5\omega_1 C_{L1}\underline{V}_{A\_pre_1}e^{j\delta}$$

$$\underline{I}_{B\_x} = \underline{I}_{B\_pre\_1} - j0.5\omega_1 C_{L1}\underline{V}_{B\_pre\_1}$$

$\underline{I}_{A\_pre\_a}, \underline{I}_{A\_pre\_b}, \underline{I}_{A\_pre\_c}$ are the pre-fault currents from phases (a, b, c) at the station A, $\underline{I}_{A\_pre\_1}$ is the positive sequence phasor, wherein, when calculating at end B, index A is substituted with index B and vice versa.

4. The method according to claim 1, further comprising calculating a compensation value for a shunt capacitance of said section of a line according to a formula:

$$d_{A\_comp} = \frac{(\text{real}(\underline{A}_v)\,\text{imag}(a_{F1}\underline{M}_{1A} + a_{F2}\underline{M}_{2A}) - \text{imag}(\underline{A}_v)\,\text{real}(a_{F1}\underline{M}_{1A} + a_{F2}\underline{M}_{2A}))}{(\text{real}(\underline{Z}_{L1}^{long}\underline{A}_{i\_comp})\,\text{imag}(a_{F1}\underline{M}_{1A} + a_{F2}\underline{M}_{2A}) - \text{imag}(\underline{Z}_{L1}^{long}\underline{A}_{i\_comp})\,\text{real}(a_{F1}\underline{M}_{1A} + a_{F2}\underline{M}_{2A}))}$$

where:

$$\underline{A}_{i\_comp} = a_1\underline{I}_{A1\_comp}e^{j\delta} + a_2\underline{I}_{A2\_comp}e^{j\delta} + a_0\frac{\underline{Z}_{L0}^{long}}{\underline{Z}_{L1}^{long}}\underline{I}_{A0\_comp}e^{j\delta}$$

$\underline{I}_{A1\_comp}, \underline{I}_{A2\_comp}, \underline{I}_{A0\_comp}$—are the positive, negative and zero sequence currents after the compensation, $$\underline{Z}_{L1}^{long} -$$

is the positive sequence impedance of a line with taking into account the distributed long line model $$\underline{Z}_{L0}^{long} -$$

as above, but for the zero sequence, wherein a compensation value for a shunt capacitance $d_{B\_comp}$ is calculated by means of a corresponding formula by substituting the values measured at end A with values measured at end B and vice versa.

5. A device for fault location in a section of a transmission line using measurements of current and voltage at a first end and a second end of said section, the device comprising:

means for storing said measurements of post-phase voltages and post-phase currents from each of said first end and said second end, means for determining whether a current transformer at said first end is saturated, means for determining whether a current transformer at said second end is saturated, and calculating means for calculating a distance to said fault using said post-fault phase voltages and by using only the post-fault phase currents from one of said first end and said second end where no current transformer is saturated.

6. The device according to claim 5, wherein the means for calculating the distance to a fault includes a formula:

$$d_A = \frac{\text{real}(\underline{A}_v)\,\text{imag}(a_{F1}\underline{M}_{1A} + a_{F2}\underline{M}_{2A}) - \text{imag}(\underline{A}_v)\,\text{real}(a_{F1}\underline{M}_{1A} + a_{F2}\underline{M}_{2A})}{\text{real}(\underline{Z}_{L1}\underline{A}_i)\,\text{imag}(a_{F1}\underline{M}_{1A} + a_{F2}\underline{M}_{2A}) - \text{imag}(\underline{Z}_{L1}\underline{A}_i)\,\text{real}(a_{F1}\underline{M}_{1A} + a_{F2}\underline{M}_{2A})} \quad (10)$$

where:

$$\underline{A}_v = a_1\underline{V}_{A1}e^{j\delta} + a_2\underline{V}_{A2}e^{j\delta} + a_0\underline{V}_{A0}e^{j\delta}$$

$$\underline{A}_i = a_1\underline{I}_{A1}e^{j\delta} + a_2\underline{I}_{A2}e^{j\delta} + a_0\frac{\underline{Z}_{L0}}{\underline{Z}_{L1}}\underline{I}_{A0}e^{j\delta}$$

$$\underline{M}_{1A} = \frac{-\underline{V}_{A1}e^{j\delta} + \underline{V}_{B1}}{\underline{Z}_{L1}} + \underline{I}_{A1}e^{j\delta}$$

$$\underline{M}_{2A} = \frac{-\underline{V}_{A2}e^{j\delta} + \underline{V}_{B2}}{\underline{Z}_{L1}} + \underline{I}_{A2}e^{j\delta}$$

$\underline{Z}_{L1}$—impedance of a whole line for the positive (negative) sequence, l—total line length, $\alpha_1, \alpha_2, \alpha_0, \alpha_{F1}, \alpha_{F2}$—are coefficients dependent on a fault type, wherein the distance to fault $d_B$ is calculated means of a corresponding formula by substituting the values measured at end A with values measured at end B and vice versa.

7. The device according to claim 5, wherein the means for calculating the distance to a fault includes a formula to calculate a compensation value for a shunt capacitance of said section of a line:

$$d_{A\_comp} = \frac{(\text{real}(\underline{A}_v)\text{imag}(\underline{a}_{F1}\underline{M}_{1A} + \underline{a}_{F2}\underline{M}_{2A}) - \text{imag}(\underline{A}_v)\text{real}(\underline{a}_{F1}\underline{M}_{1A} + \underline{a}_{F2}\underline{M}_{2A}))}{(\text{real}(\underline{Z}_{L1}^{long}\underline{A}_{i\_comp})\text{imag}(\underline{a}_{F1}\underline{M}_{1A} + \underline{a}_{F2}\underline{M}_{2A}) - \text{imag}(\underline{Z}_{L1}^{long}\underline{A}_{i\_comp})\text{real}(\underline{a}_{F1}\underline{M}_{1A} + \underline{a}_{F2}\underline{M}_{2A}))}$$

where:

$$\underline{A}_{i\_comp} = \underline{a}_1 \underline{I}_{A1\_comp} e^{j\delta} + \underline{a}_2 \underline{I}_{A2\_comp} e^{j\delta} + \underline{a}_0 \frac{\underline{Z}_{L0}^{long}}{\underline{Z}_{L1}^{long}} \underline{I}_{A0\_comp} e^{j\delta},$$

$\underline{I}_{A1\_comp}, \underline{I}_{A2\_comp}, \underline{I}_{A0\_comp}$—are the positive, negative and zero sequence currents after the compensation, $$\underline{Z}_{L1}^{long} -$$

is the positive sequence impedance of a line with taking into account the distributed long line model $$-\underline{Z}_{L0}^{long} -$$

as above, but for the zero sequence,
wherein the distance to a fault $d_B$ is calculated by means of a corresponding formula by substituting the values measured at end A with values measured at end B and vice versa.

8. A computer program product, comprising:
a computer readable medium; and
at least one of computer code means or software code portions recorded on the computer readable medium for making a computer or processor perform the steps of
receiving post-fault phase voltages and post fault phase currents from each of said first end and said second end;
determining whether a current transformer at said first end is saturated;
determining whether a current transformer at said second end is saturated; and
locating the fault by calculating a distance to a said fault using the post-fault phase voltages and by using only the post-fault phase currents from one of the first end and the second end where no current transformer is saturated.

9. A method according to claim 1, further comprising:
carrying out at least one of repair or maintenance of the section of the transmission line.

* * * * *